United States Patent
Yamachi

(10) Patent No.: US 12,532,528 B2
(45) Date of Patent: Jan. 20, 2026

(54) SEMICONDUCTOR APPARATUS, IMAGING DEVICE, AND ELECTRONIC APPARATUS

(71) Applicant: SONY SEMICONDUCTOR SOLUTIONS CORPORATION, Kanagawa (JP)

(72) Inventor: Ryosuke Yamachi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 524 days.

(21) Appl. No.: 18/041,380

(22) PCT Filed: Aug. 10, 2021

(86) PCT No.: PCT/JP2021/029561
§ 371 (c)(1),
(2) Date: Feb. 10, 2023

(87) PCT Pub. No.: WO2022/044797
PCT Pub. Date: Mar. 3, 2022

(65) Prior Publication Data
US 2023/0299162 A1 Sep. 21, 2023

(30) Foreign Application Priority Data
Aug. 24, 2020 (JP) ................................. 2020-141234
Apr. 21, 2021 (JP) ................................. 2021-072050

(51) Int. Cl.
*H10D 30/62* (2025.01)
*H10D 64/27* (2025.01)
*H10F 39/00* (2025.01)

(52) U.S. Cl.
CPC .......... *H10D 64/516* (2025.01); *H10D 30/62* (2025.01); *H10F 39/80373* (2025.01)

(58) Field of Classification Search
CPC .... H10D 30/62; H10D 64/516; H10D 30/021; H10D 30/60; H10D 30/6212;
(Continued)

(56) References Cited

U.S. PATENT DOCUMENTS

| | | | |
|---|---|---|---|
| 2008/0061383 A1 | 3/2008 | Kawakita et al. | |
| 2017/0358680 A1 | 12/2017 | Jeong et al. | |
| 2022/0367545 A1* | 11/2022 | Kimizuka | H10D 30/60 |

FOREIGN PATENT DOCUMENTS

| | | |
|---|---|---|
| JP | 2008-066516 | 3/2008 |
| JP | 2016-054215 | 4/2016 |

(Continued)

OTHER PUBLICATIONS

International Search Report and Written Opinion prepared by the Japan Patent Office on Sep. 6, 2021, for International Application No. PCT/JP2021/029561, 2 pgs.

*Primary Examiner* — Monica D Harrison
(74) *Attorney, Agent, or Firm* — SHERIDAN ROSS. P.C.

(57) ABSTRACT

Provided are a semiconductor apparatus, an imaging device, and an electronic apparatus that improve the gate controllability of a field-effect transistor. The field-effect transistor of the apparatus includes a semiconductor region in which a channel is formed, a gate electrode covering the semiconductor region, and a gate insulating film between the semiconductor region and the gate electrode. The semiconductor region has an upper surface and a first side surface on one side of the upper surface in a gate width direction of the gate electrode. The gate electrode includes a first portion facing the upper surface and a second portion facing the first side surface. The gate insulating film includes a first film portion between the upper surface and the first portion, and a second film portion between the first side surface and the second portion. The second film portion is thickest in a portion close to the upper surface.

14 Claims, 22 Drawing Sheets

(58) Field of Classification Search
CPC ............. H10D 84/0126; H10D 84/038; H10D 84/834; H10F 39/80373; H10F 39/014; H10F 39/12; H04N 25/70
USPC .......................................................... 257/43
See application file for complete search history.

(56) References Cited

FOREIGN PATENT DOCUMENTS

| | | |
|---|---|---|
| JP | 2017-183636 | 10/2017 |
| JP | 2021-034435 | 3/2021 |
| WO | WO 2019/156673 | 8/2019 |

\* cited by examiner

SEMICONDUCTOR APPARATUS, IMAGING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2021/029561, having an international filing date of 10 Aug. 2021, which designated the United States, which PCT application claimed the benefit of Japanese Patent Application Nos. 2020-141234, filed 24 Aug. 2020, and 2021-072050, filed 21 Apr. 2021, the entire disclosures of each of which are incorporated herein by reference.

TECHNICAL FIELD

The present disclosure relates to a semiconductor apparatus, an imaging device, and an electronic apparatus.

BACKGROUND ART

A field-effect transistor having a structure in which part of a gate electrode is buried in a semiconductor substrate is known. For example, Patent Literature 1 discloses a transistor that includes: a gate electrode including a fin portion formed so as to be buried from a plane portion formed planarly on the surface of a semiconductor substrate toward the inside of the semiconductor substrate; and a channel region in contact with a side surface of the fin portion via an insulation film.

CITATION LIST

Patent Literature

Patent Literature 1: Japanese Patent Application Laid-open No. 2017-183636

DISCLOSURE OF INVENTION

Technical Problem

The lower part of the channel region in contact with the side surface of the fin portion via the insulation film is more susceptible to the potential of a well than the upper part of the channel region. For example, the potential of the well flows around the lower part of the channel region, making it difficult for the current flow, in some cases. As a result, there is a possibility that the gate controllability of the field-effect transistor is reduced.

The present disclosure has been made in view of such circumstances to provide a semiconductor apparatus, an imaging device, and an electronic apparatus that are capable of improving the gate controllability of a field-effect transistor.

Solution to Problem

A semiconductor apparatus according to an aspect of the present disclosure includes: a semiconductor substrate; and a field-effect transistor provided on the semiconductor substrate. The field-effect transistor includes a semiconductor region of a first conductive type in which a channel is formed, a gate electrode covering the semiconductor region, and a gate insulating film disposed between the semiconductor region and the gate electrode. The semiconductor region has an upper surface and a first side surface positioned on one side of the upper surface in a gate width direction of the gate electrode. The gate electrode includes a first portion facing the upper surface via the gate insulating film and a second portion facing the first side surface via the gate insulating film. The gate insulating film includes a first film portion positioned between the upper surface and the first portion, and a second film portion positioned between the first side surface and the second portion. A film thickness of the second film portion is smaller in a portion thereof farther from the upper surface than in a portion thereof closer to the upper surface.

In accordance with this, by reducing the thickness of the second film portion, the lower part of the channel in contact with the second film portion is affected by the potential of the gate electrode, so that the potential of the lower part of the channel easily rises and the current easily flows. This allows the field-effect transistor to cause a current to more uniformly flow across the channel. Since the effective transistor size increases by expanding the range in which a current flows in the channel, the field-effect transistor is capable of improving mutual conductance gm and improving the gate controllability.

Further, by reducing the thickness of the second film portion, since the potential of the lower part of the channel easily rises as a whole, it is possible to reduce the electron density at the interface with the second film portion (i.e., the interfacial electron density). As a result, the field-effect transistor is capable of reducing the noise caused by the interfacial electron density and improving the noise properties.

An imaging device according to an aspect of the present disclosure include: a sensor pixel that performs photoelectric conversion; and a readout circuit that outputs a pixel signal based on charges output from the sensor pixel. The readout circuit includes an amplifier transistor that amplifies a signal of a voltage corresponding to a level of the charges output from the sensor pixel, and a selection transistor that controls output timing of the pixel signal from the amplifier transistor. At least one of the amplifier transistor or the selection transistor includes a semiconductor region of a first conductive type in which a channel is formed, a gate electrode covering the semiconductor region, and a gate insulating film disposed between the semiconductor region and the gate electrode. The semiconductor region has an upper surface and a first side surface positioned on one side of the upper surface in a gate width direction of the gate electrode. The gate electrode includes a first portion facing the upper surface via the gate insulating film and a second portion facing the first side surface via the gate insulating film. The gate insulating film includes a first film portion positioned between the upper surface and the first portion, and a second film portion positioned between the first side surface and the second portion. A film thickness of the second film portion is smaller in a portion thereof farther from the upper surface than in a portion thereof closer to the upper surface.

In accordance with this, since the mutual conductance gm and noise properties of at least one of the amplifier transistor or the selection transistor can be improved, it is possible to increase the operation speed and reduce noise of the imaging device.

An electronic apparatus according to an aspect of the present disclosure includes the imaging device described above. In accordance with this, it is possible to improve the mutual conductance gm and noise properties of at least one of the amplifier transistor or the selection transistor included in the imaging device. As a result, it is possible to increase the operation speed and reduce noise of the electronic apparatus including the imaging device.

MODES(S) FOR CARRYING OUT THE INVENTION

Hereinafter, embodiments of the present disclosure will be described with reference to the drawings. In the description of the drawings referred to in the following description, the same or similar portions are denoted by the same or similar reference symbols. However, it should be noted that the drawings are schematic and the relationship between thicknesses and planar dimensions, the ratio of thickness of each layer, and the like are different from the actual ones. Therefore, specific thicknesses and dimensions should be determined with reference to the following description. Further, it goes without saying that there are portions with different dimensional relationships and different ratios between the drawings.

Further, the definitions of directions such as up and down in the following description are merely definitions for convenience of description and do not limit the technical idea of the present disclosure. For example, it goes without saying that the up and down are converted into the right and left and interpreted when an object is observed after being rotated by 90° and the up and down are reversed and interpreted when an object is observed after being rotated by 18°.

Further, in the following description, directions are described using the terms X-axis direction, Y-axis direction, and Z-axis direction in some cases. For example, the X-axis direction and the Y-axis direction are directions parallel to a surface 10a of a semiconductor substrate 10 described below. The Z-axis direction is the normal direction of the surface 10a of the semiconductor substrate 10. The X-axis direction, the Y-axis direction, and the Z-axis direction are orthogonal to each other. Further, in the following description, the phrase "in plan view" means viewing from the normal direction of the surface 10a of the semiconductor substrate 10 (i.e., the Z-axis direction).

Further, in the following description, a case where a first conductive type is a p-type and a second conductive type is an n-type will be exemplary described. However, the conductive types may be selected in the opposite relationship, i.e., the first conductive type may be an n-type and the second conductive type may be a p-type. Further, + and − attached to p or n respectively mean that a semiconductor region has a relatively high or low impurity concentration as compared with a semiconductor region to which + and − are not attached. However, even if the semiconductor regions are given the same p and p (or the same n and n), it does not mean that the impurity concentrations of the semiconductor regions are exactly the same.

First Embodiment

Configuration Example of Semiconductor Apparatus

Figure 1:
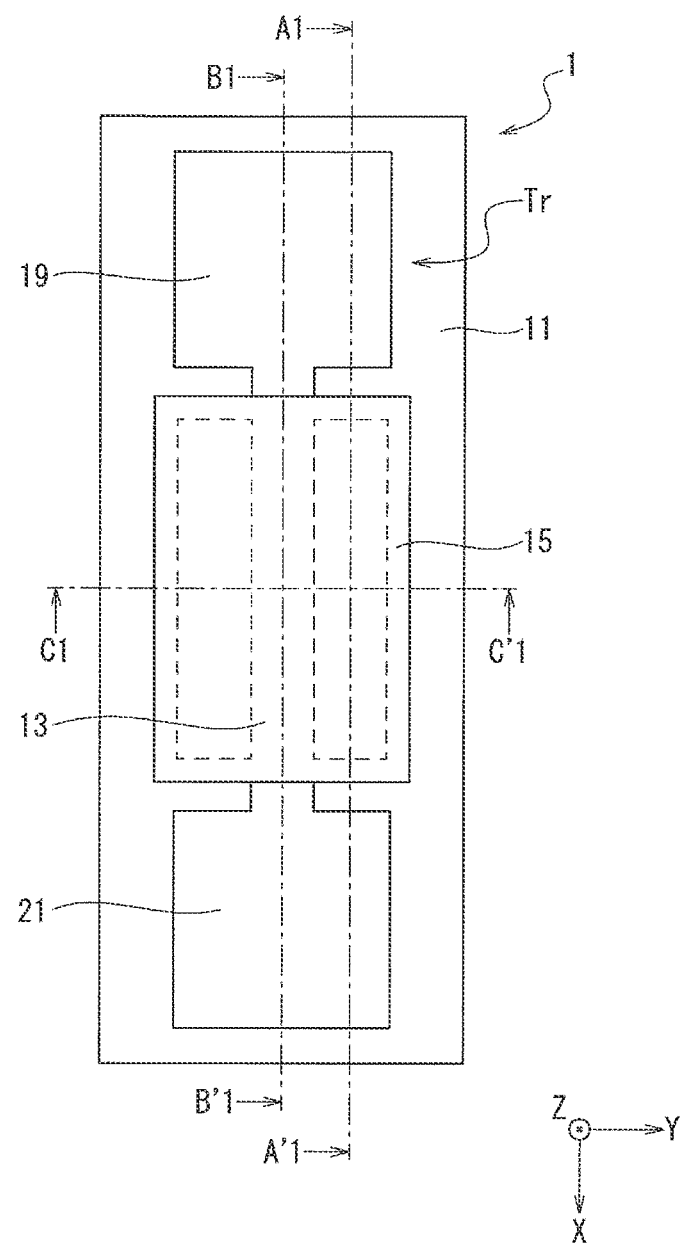
FIG. 1 is a plan view showing a configuration example of a semiconductor apparatus according to a first embodiment of the present disclosure.
Figure 2:
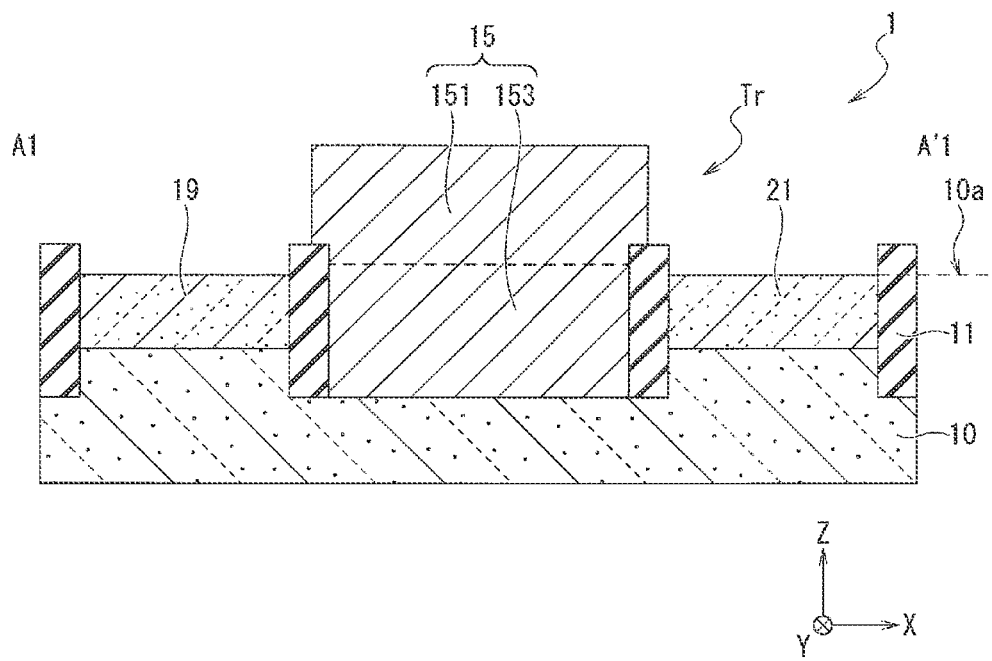
FIG. 2 is a cross-sectional view showing a configuration example of the semiconductor apparatus according to the first embodiment of the present disclosure.
Figure 3:
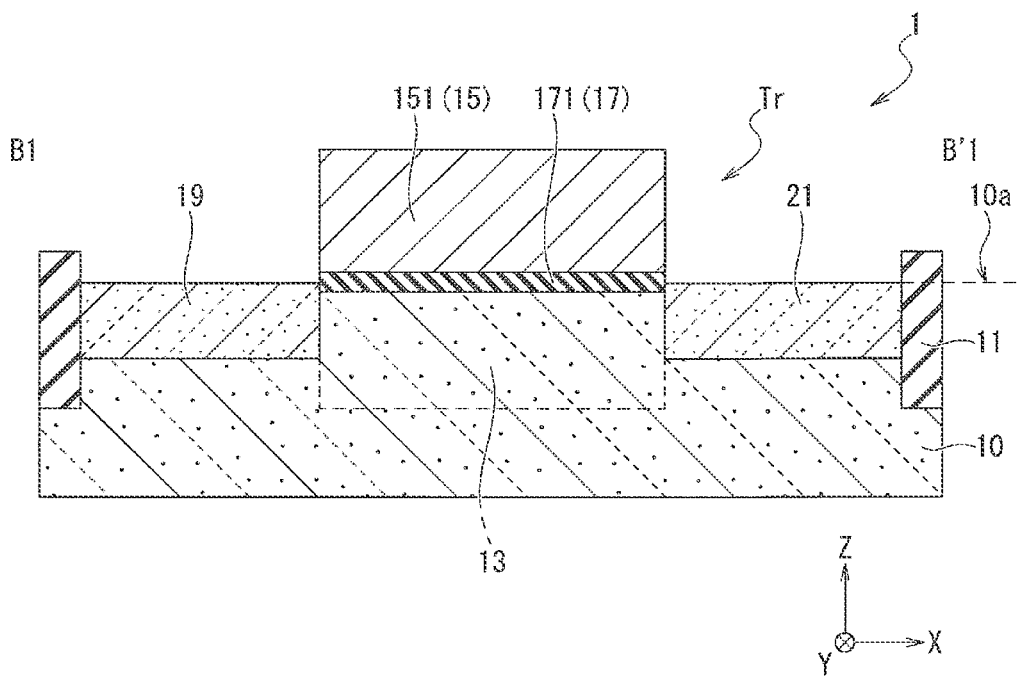
FIG. 3 is a cross-sectional view showing a configuration example of the semiconductor apparatus according to the first embodiment of the present disclosure.
Figure 4:
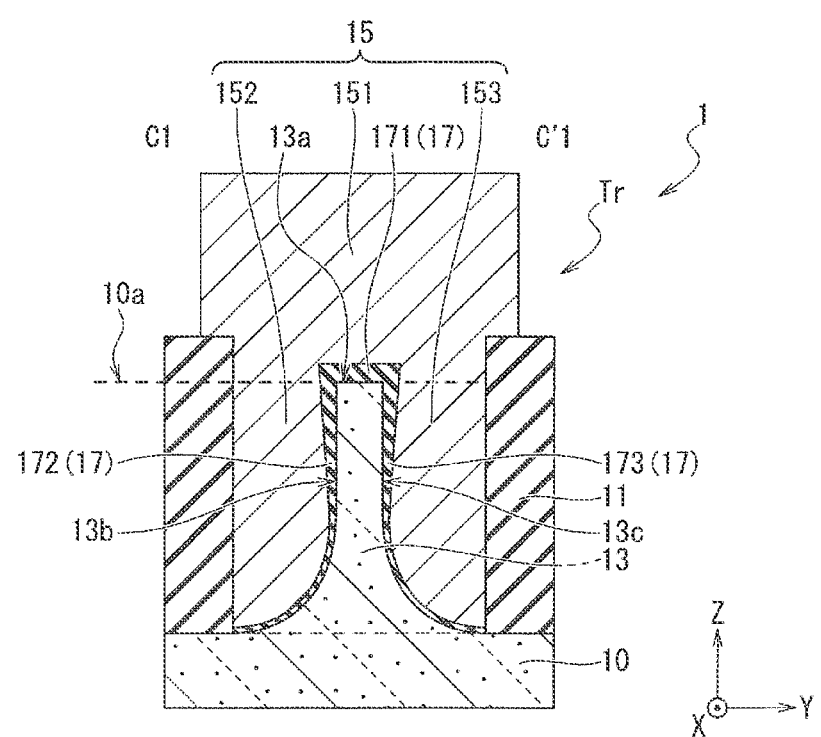
FIG. 4 is a cross-sectional view showing a configuration example of the semiconductor apparatus according to the first embodiment of the present disclosure.

FIG. 1 is a plan view showing a configuration example of a semiconductor apparatus according to a first embodiment of the present disclosure. FIG. 2 to FIG. 4 are each a cross-sectional view showing a configuration example of the semiconductor apparatus according to the first embodiment of the present disclosure. FIG. 2 shows the cross section of FIG. 1 taken along the line A1-A'1 parallel to the X-axis direction. FIG. 3 shows the cross section of FIG. 1 taken along the line B1-B'1 parallel to the X-axis direction. FIG. 4 shows the cross section of FIG. 1 taken along the line C1-C'1 parallel to the Y-axis direction.

As shown in FIG. 2 to FIG. 4, a semiconductor apparatus 1 according to the first embodiment includes the semiconductor substrate 10 and a MOS (Metal Oxide Semiconductor) transistor Tr (an example of a "field-effect transistor" according to the present disclosure) provided on the side of the surface 10a of the semiconductor substrate 10. The semiconductor substrate 10 is formed of, for example, single crystal silicon. The MOS transistor Tr is electrically isolated from other devices by a device isolation layer 11 provided on the side of the surface 10a of the semiconductor substrate 10. The device isolation layer 11 is an insulation film and includes, for example, a silicon oxide film ($SiO_2$ film).

The MOS transistor Tr is an n-type MOS transistor. The MOS transistor Tr includes a p-type semiconductor region 13 in which a channel is formed, a gate electrode 15 covering the semiconductor region 13, a gate insulating film 17 disposed between the semiconductor region 13 and the gate electrode 15, an n-type source region 19 provided in the semiconductor substrate 10, and an n-type drain region 21 provided in the semiconductor substrate 10. Since the channel of the MOS transistor Tr is formed in the semiconductor region 13, the semiconductor region 13 may be referred to as a channel region in the following description.

The semiconductor region 13 is part of the semiconductor substrate 10 and is formed of single crystal silicon. Alternatively, the semiconductor region 13 may be a single crystal silicon layer formed on the semiconductor substrate 10 by an epitaxial growth method. The semiconductor region 13 is a portion formed by etching part of the semiconductor substrate 10 on the side of the surface 10a and has, for example, a fin shape. The semiconductor region 13 has, for example, a shape that is long in a gate length direction (e.g., the X-axis direction) and is short in a gate width direction (e.g., the Y-axis direction) in plan view from the normal direction (e.g., the Z-axis direction) of the surface 10a of the semiconductor substrate 10. That is, the semiconductor region 13 has a rectangular shape that is long in the X-axis direction and short in the Y-axis direction in plan view.

As shown in FIG. 4, the semiconductor region 13 has an upper surface 13a, a first side surface 13b, and a second side surface 13c. The upper surface 13a is part of the surface 10a of the semiconductor substrate 10. The upper surface 13a is parallel to the X-axis direction and the Y-axis direction. The first side surface 13b is positioned on one side (left side in FIG. 4) of the upper surface 13a in the Y-axis direction. The second side surface 13c is positioned on the other side (right side in FIG. 4) of the upper surface 13a in the Y-axis direction. The first side surface 13b and the second side surface 13c extend in a direction crossing the upper surface 13a.

For example, part of the first side surface 13b, which is a side surface positioned on the side closer to the upper surface 13a (i.e., the upper part of the first side surface 13b), has a surface parallel (or substantially parallel) to the X-axis direction and the Z-axis direction. Further, another part of the first side surface 13b, which is a side surface positioned on the side farther from the upper surface 13a (i.e., the lower part of the first side surface 13b), has a curved surface that gradually widens to the outside of the semiconductor region 13 as the distance from the upper surface 13a increases. Similarly, part of the second side surface 13c, which is a side surface positioned on the side closer to the upper surface 13a (i.e., the upper part of the second side surface 13c), has a surface parallel (or substantially parallel) to the X-axis direction and the Z-axis direction. Further, another part of the second side surface 13c, which is a side surface positioned on the side farther from the upper surface 13a (i.e., the lower part of the second side surface 13cI has a curved surface that gradually widens to the outside of the semiconductor region 13 as the distance from the upper surface 13a increases. As a result, the cross section of the semiconductor region 13 taken along the Y-Z plane has a shape that is long in the Y-axis direction in a portion on the lower side than a portion on the side of the upper surface 13a (i.e., the upper part) and the lower part is rounded.

The gate electrode 15 covers the semiconductor region 13 via the gate insulating film 17. For example, the gate electrode 15 includes a first portion 151 that faces the upper surface 13a of the semiconductor region 13 via the gate insulating film 17, a second portion 152 that faces the first side surface 13b of the semiconductor region 13 via the gate insulating film 17, and a third portion 153 that faces the second side surface 13c of the semiconductor region 13 via the gate insulating film 17. The second portion 152 and the third portion 153 are connected to the lower surface of the first portion 151. In the Y-axis direction, the second portion 152 of the gate electrode 15 is disposed on one side of the semiconductor region 13, and the third portion 153 of the gate electrode 15 is disposed on the other side of the semiconductor region 13. The semiconductor region 13 is sandwiched between the second portion 152 and the third portion 153 of the gate electrode 15 from both right and left sides.

As a result, the gate electrode 15 is capable of simultaneously applying a gate voltage to the upper surface 13a, the first side surface 13b, and the second side surface 13c of the semiconductor region 13. That is, the gate electrode 15 is capable of simultaneously applying a gate voltage to the semiconductor region 13 from a total of three directions, i.e., the upper side and the right and left sides. The gate electrode 15 includes, for example, a polysilicon (Poly-Si) film.

Note that the first portion 151 may be referred to as a horizontal gate electrode. Each of the second portion 152 and the third portion 153 may be referred to as a vertical gate electrode or a fin portion. Further, the MOS transistor Tr may be referred to as a MOS transistor having a dug gate structure because of the shape thereof in which the side of the surface 10a of the semiconductor substrate 10 is dug and the second portion 152 and the third portion 153 of the gate electrode 15 are disposed in the dug region. Alternatively, the MOS transistor Tr may be referred to as a FinFET (Fin Field Effect Transistor) because the gate electrode 15 includes a fin portion. Alternatively, the MOS transistor Tr may be referred to as a dug FinFET because it has the two features described above.

The gate insulating film 17 is provided so as to continuously cover the upper surface 13a, the first side surface 13b, and the second side surface 13c of the semiconductor region 13. The gate insulating film 17 includes a first film portion 171 positioned between the upper surface 13a of the semiconductor region 13 and the first portion 151 of the gate electrode 15, a second film portion 172 positioned between the first side surface 13b of the semiconductor region 13 and the second portion 152 of the gate electrode 15, and a third film portion 173 positioned between the second side surface 13c of the semiconductor region 13 and the third portion 153 of the gate electrode 15.

The film thickness of the first film portion 171 is uniform or substantially uniform. The film thickness of the second film portion 172 is smaller in a portion thereof farther from the upper surface 13a (i.e., the lower part of the second film portion 172) than in a portion thereof closer to the upper surface 13a (i.e., the upper part of the second film portion 172). For example, the film thickness of the second film portion 172 decreases as the distance from the upper surface 13a increases. Similarly, the film thickness of the third film portion 173 is smaller than in a portion thereof farther from the upper surface 13a (i.e., the lower part of the third film portion 173) than in a portion thereof closer to the upper surface 13a (i.e., the upper part of the third film portion 173). For example, the film thickness of the third film portion 173 decreases as the distance from the upper surface 13a increases. The gate insulating film 17 includes, for example, a $SiO_2$ film.

The source region 19 and the drain region 21 are provided on the side of the surface 10a of the semiconductor substrate 10. In the gate length direction (e.g., the X-axis direction), the source region 19 is connected to one side of the semiconductor region 13 and the drain region 21 is connected to the other side of the semiconductor region 13.

Note that although not shown, the MOS transistor Tr may included a side wall. The side wall is provided around the gate electrode 15. The side wall includes an insulation film such as a silicon nitride film (SiN) and a silicon oxide film ($SiO_2$).

Method of Producing Semiconductor Apparatus

Next, a method of producing the semiconductor apparatus 1 shown in FIG. 1 to FIG. 4 will be described. The semiconductor apparatus 1 is produced using various devices such as a deposition device (including a CVD (Chemical Vapor Deposition) device, a thermal oxidation furnace, a sputtering device, and a resist coating device), an exposure device, an ion implantation device, an annealing device, an etching device, and a CMP (Chemical Mechanical Polishing) device. Hereinafter, these devices will be collectively referred to as a production device.

Figure 5:
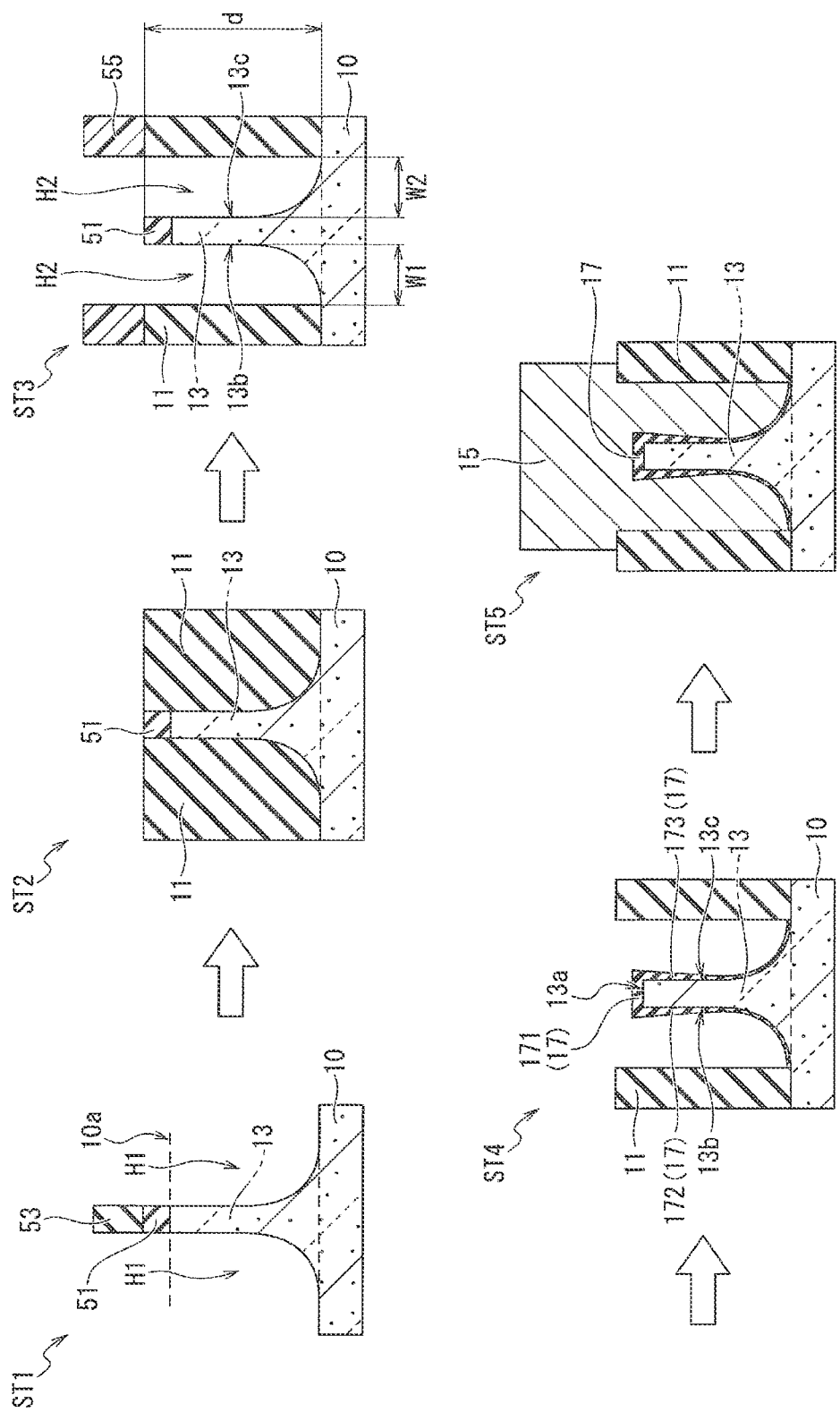
FIG. 5 is a cross-sectional view showing a method of producing the semiconductor apparatus according to the first embodiment of the present disclosure in order of processes.

FIG. 5 is a cross-sectional view showing a method of producing the semiconductor apparatus 1 according to the first embodiment of the present disclosure in order of processes. As shown in Step ST1 in FIG. 5, the production device forms an insulation film 51, an oxide film 53, and a resist pattern (not shown) on the surface 10a of the semiconductor substrate 10 in this order. The semiconductor substrate 10 is, for example, a bulk silicon substrate. The insulation film 51 is, for example, a silicon nitride film (SiN film). The oxide film 53 is, for example, a silicon oxide film ($SiO_2$ film). The insulation film 51 and the oxide film 53 are formed by a CVD method.

Next, the production device etches the oxide film 53 using the resist pattern as a mask. After patterning the oxide film 53 into the shape of the resist pattern, the production device removes the resist pattern. Next, the production device etches the insulation film 51 using the patterned oxide film 53 as a mask. As a result, the production device forms a pattern (i.e., a hard mask) including the insulation film 51. Next, the production device etches the side of the surface 10a of the semiconductor substrate 10 using the hard mask including the insulation film 51. As a result, a trench H1 is formed on the side of the surface 10a of the semiconductor substrate 10. Further, when the trench H1 is formed, the semiconductor region 13 is defined on the semiconductor substrate 10.

Note that the production device may form a p-type well in the semiconductor substrate 10 before forming the insulation film 51. This well may be a p-type buried well formed so as to be buried inside the semiconductor substrate 10 (e.g., at a position away from the surface 10a in a depth direction by a certain distance), a p-type well formed so as to face the surface 10a of the semiconductor substrate 10, or both of them. Examples of the former include a p-type well layer 312 shown in FIG. 14 described below (an example of an "impurity diffusion layer" according to the present disclosure). Examples of the latter include a $p^-$-type well layer 311 shown in FIG. 14 described below. In the case where a p-type well is formed in the semiconductor substrate 10, the production device may etch part of this well to form the trench H1.

Next, as shown in Step ST2 in FIG. 5, the production device deposits an insulation film on the semiconductor substrate 10 by a CVD method to bury the trench H1. This insulation film is, for example, an $SiO_2$ film. Next, the production device forms the device isolation layer 11 from this insulation film by performing CMP processing on the surface of this insulation film to planarize the surface. In this CMP processing, since the insulation film 51 functions as a stopper, the insulation film 51 and the device isolation layer 11 are flush (or substantially flush).

Next, as shown in Step ST3 in FIG. 5, the production device forms a resist pattern 55 on the device isolation layer 11. The production device then etches the device isolation layer 11 using the resist pattern 55 as a mask. As a result, a trench H2 is formed on both sides of the semiconductor region 13. After forming the trench H2, the production device removes the resist pattern 55.

Next, the production device etches and removes the insulation film 51. Then, as shown in Step ST4 in FIG. 5, the production device forms the gate insulating film 17 by thermally oxidizing the upper surface 13a of the semiconductor region 13 exposed by removing the insulation film 51, and the first side surface 13b and the second side surface 13c of the semiconductor region 13 exposed by forming the trench H2. The first film portion 171 of the gate insulating film 17 is formed in the upper surface 13a of the semiconductor region 13, the second film portion 172 of the gate insulating film 17 is formed in the first side surface 13b of the semiconductor region 13, and the third film portion 173 of the gate insulating film 17 is formed in the second side surface 13c of the semiconductor region 13.

Since the width of the trenches H2 positioned on both sides of the semiconductor region 13 is narrow, it is difficult for the oxidizing species (e.g., an oxygen ($O_2$) gas) to reach the bottom side of the trench H2 in the process of forming the gate insulating film 17, as compared with the opening side of the trench H2. For example, when the distance between the first side surface 13b and the device isolation layer 11 is defined as w1, the distance between the second side surface 13c and the device isolation layer 11 is defined as w2, and the thickness of the device isolation layer 11 is d, a relationship of W1=W2<d is established. Both the distances w1 and w2 described above are shorter than the thickness d of the device isolation layer 11. Each of the distances w1 and w2 corresponds to the width of the trench H2 and the thickness d corresponds to the depth of the trench H2.

Since the width of the trench H2 is narrow and it is difficult for the oxidizing species to reach the bottom side as described above, the gate insulating film 17 is formed to be thinner as the distance from the bottom of the trench H2 decreases. For example, the second film portion 172 is formed to be thinner as the distance from the upper surface 13a increases (i.e., toward the lower part). The third film portion 173 is also formed to be thinner as the distance from the upper surface 13a increases (i.e., closer to the lower part).

Next, as shown in Step ST5 in FIG. 5, the production device deposits an electrode member such as polysilicon (poly-Si) on the semiconductor substrate 10 using a CVD method to bury the trench H2. The production device then patterns the electrode member to form the gate electrode 15. After that, the production device implants n-type impurity ions into the semiconductor substrate 10 using the gate electrode 15 as a mask and performs heat treatment for activating the implanted n-type impurity on the semiconductor substrate 10. As a result, the source region 19 and the drain region 21 (see FIG. 1 to FIG. 3) are formed. The MOS transistor Tr shown in FIG. 1 to FIG. 4 is completed through the above processes.

Comparison of Potential

Figure 6:
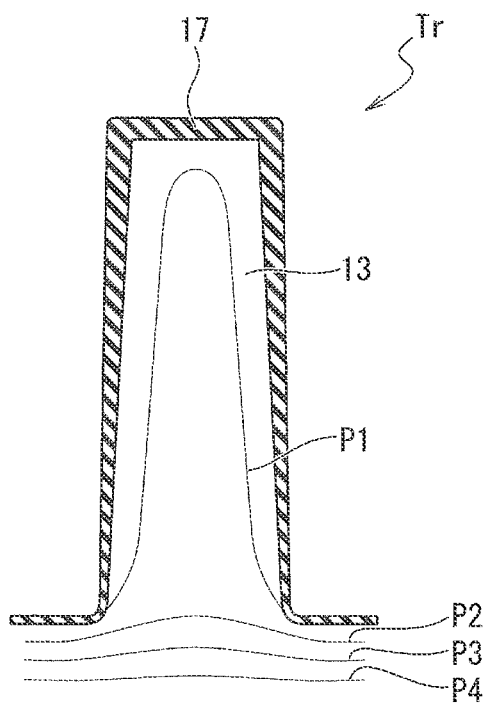
FIG. 6 is an image diagram showing a potential distribution of a semiconductor region (channel region) in a state where a voltage whose value is a threshold value or more is applied to a gate electrode and an ON-current flows in a MOS transistor according to the first embodiment of the present disclosure.
Figure 7:
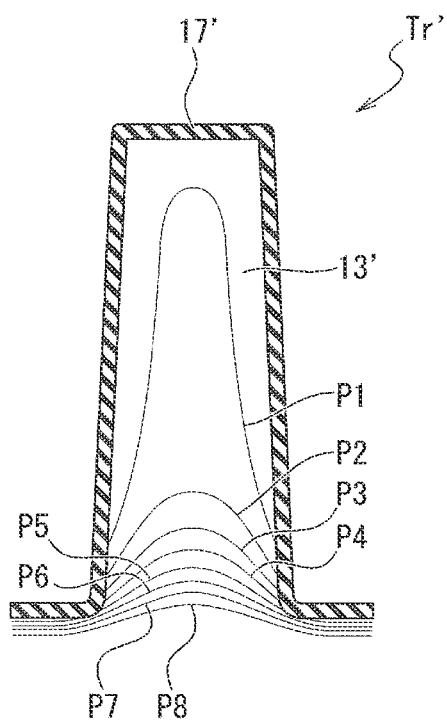
FIG. 7 is a diagram showing results of simulating a potential distribution of a channel region in a state where a voltage whose value is a threshold value or more is applied to a gate electrode and an ON-current flows in a MOS transistor according to a Comparative Example of the present disclosure.

FIG. 6 is an image diagram showing a potential distribution of the semiconductor region (channel region) 13 in a state where a voltage whose value is a threshold value or more is applied to the gate electrode 15 and an ON-current flows in the MOS transistor Tr according to the first embodiment of the present disclosure. FIG. 7 is a diagram showing results of simulating a potential distribution of a channel region 13' in a state where a voltage whose value is a threshold value or more is applied to a gate electrode and an ON-current flows in a MOS transistor Tr' according to a Comparative Example of the present disclosure. In FIG. 6 and FIG. 7, lines P1 to P8 are lines each schematically showing a potential from the well positioned on the lower side of the channel region and are equipotential lines connecting points having the same potential. In the lines P1 to P8, the line P1 is an equipotential line indicating the highest potential and the line P8 is an equipotential line indicating the lowest potential. The potentials of the lines P1 to P8 decrease as the number attached after P increases.

In the MOS transistor Tr' according to the Comparative Example in FIG. 7, the difference from the MOS transistor Tr according to the first embodiment shown in FIG. 6 is the thickness of the gate insulating film. As shown in FIG. 6, the thickness of the gate insulating film 17 of the MOS transistor Tr decreases toward the lower part of the channel region 13. Meanwhile, the thickness of a gate insulating film 17' of the MOS transistor Tr' shown in FIG. 7 is uniform.

As can be seen by comparing FIG. 6 and FIG. 7 with each other, since the thickness of the gate insulating film 17 of the MOS transistor Tr according to the first embodiment of the present disclosure decreases toward the lower part of the channel region 13, the potential of the gate electrode is transmitted easier and it is more difficult for the potential from the well to flow around as approaching the lower part of the channel region 13. As a result, in the MOS transistor Tr, the potential is high and a current easily flows in the entire lower part of the channel region 13. A current easily flows also inside the lower part of the channel region 13. As a result, in the lower part of the channel region 13, it is possible to prevent electrons from concentrating at the interface with the gate insulating film 17 and reduce the electron density at the interface with the gate insulating film 17 (i.e., the interfacial electron density).

Relationship Between Interfacial Electron Density and Noise

The noise tends to decrease as the interfacial electron density decreases (the number of electrons decreases). In the MOS transistor Tr according to the first embodiment of the present disclosure, since the interfacial electron density in the lower part of the channel region 13 can be reduced, it is possible to reduce the noise.

Figure 8:
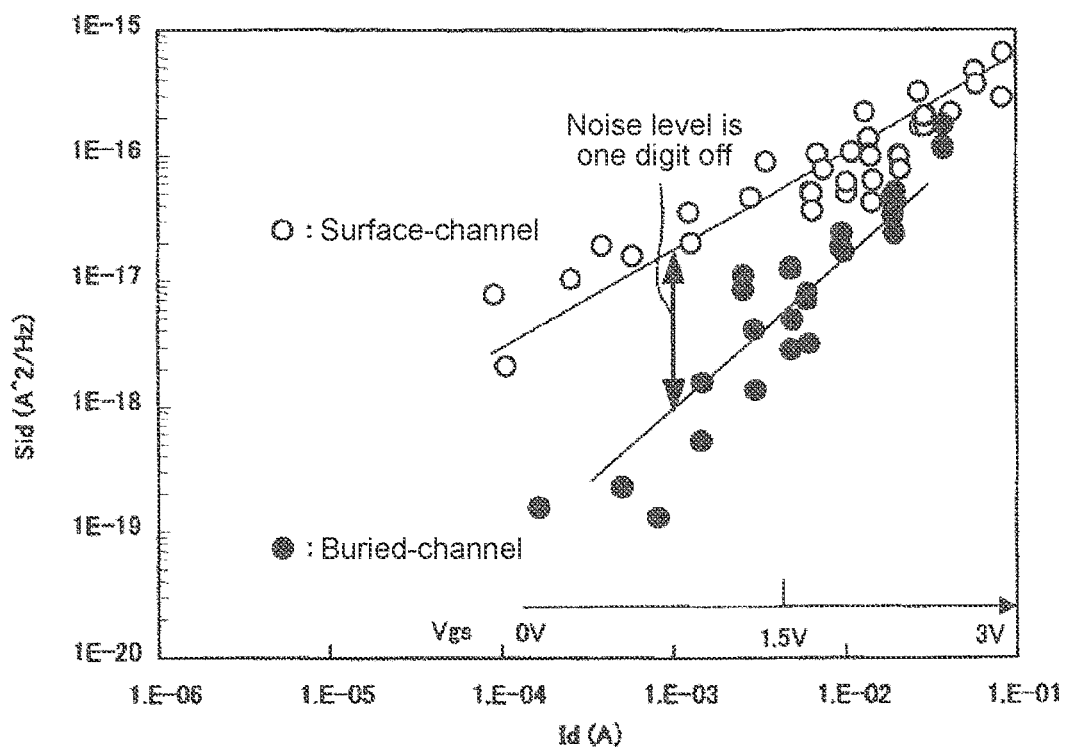
FIG. 8 is a diagram showing an example of comparing 1/f noise between a buried-channel NMOS transistor and a surface-channel NMOS transistor.
Figure 9:
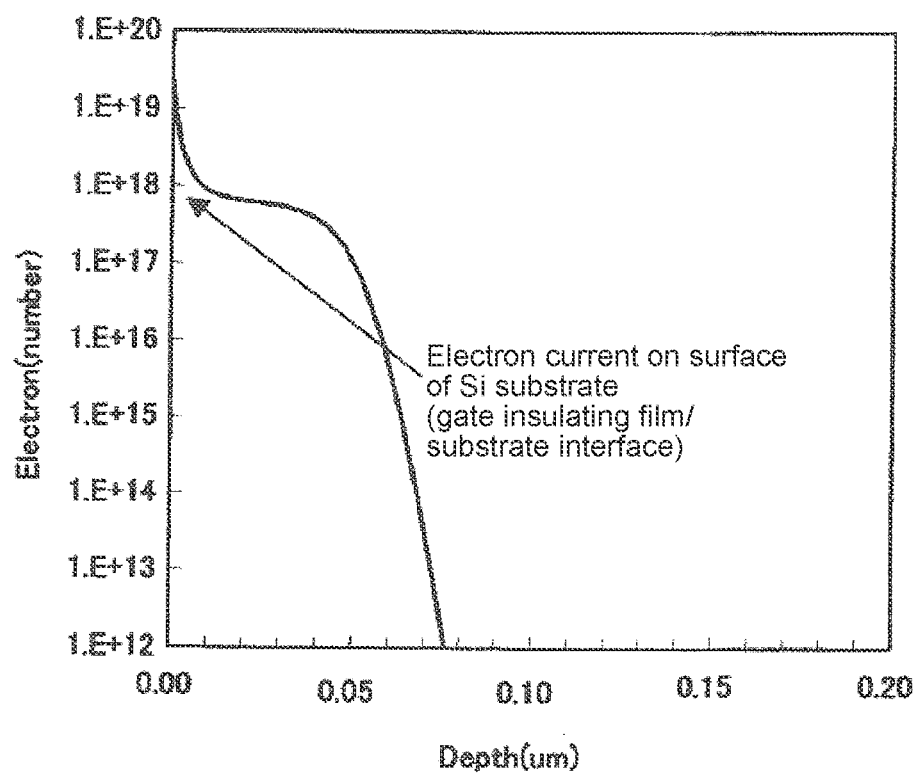
FIG. 9 is a diagram showing an electron density profile when a surface-channel NMOS transistor is used.
Figure 10:
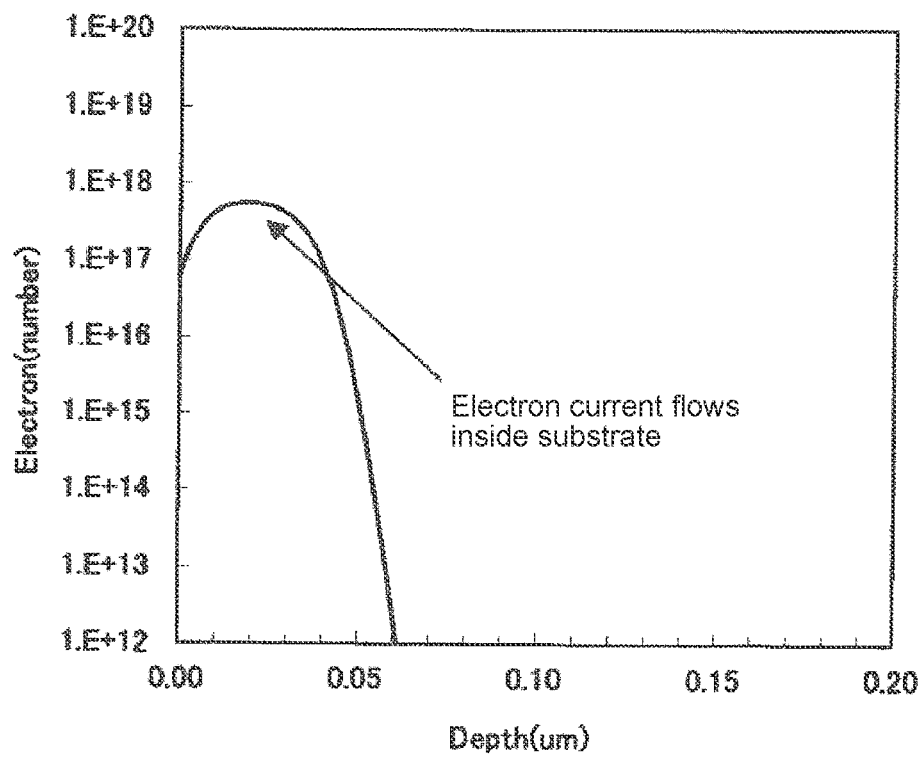
FIG. 10 is a diagram showing an electron density profile when a buried-channel NMOS transistor is used.

The relationship between the interfacial electron density and the noise (e.g., 1/f noise) will be described in more detail. FIG. 8 is a diagram showing an example of comparing the 1/f noise between a buried-channel NMOS transistor and a surface-channel NMOS transistor. FIG. 9 is a diagram showing an electron density profile when a surface-channel NMOS transistor is used. FIG. 10 is a diagram showing an electron density profile when a buried-channel NMOS transistor is used.

As shown in FIG. 9, in the surface-channel NMOS transistor, a channel is formed at the interface between the gate insulating film and the semiconductor substrate (i.e., in the vicinity of the surface of the semiconductor substrate) and a current flows through the channel. Meanwhile, as shown in FIG. 10, in the buried-channel NMOS transistor, a channel is formed not only at the interface between the gate insulating film and the semiconductor substrate but also inside the semiconductor substrate away from the gate insulating film and a current flows through the channel.

The fact that a current flows through the interface between the gate insulating film and the semiconductor substrate means that the interfacial electron density increases. As shown in FIG. 8, in both the buried-channel NMOS transistor and the surface-channel NMOS transistor, noise properties change depending on the current flowing through the interface (i.e., depending on the interfacial electron density).

Effects of First Embodiment

As described above, the semiconductor apparatus 1 according to the first embodiment of the present disclosure includes the semiconductor substrate 10 and the MOS transistor Tr provided on the semiconductor substrate 10. The MOS transistor Tr includes the p-type semiconductor region 13 in which a channel is formed, the gate electrode 15 covering the semiconductor region 13, and the gate insulating film 17 disposed between the semiconductor region 13 and the gate electrode 15. The semiconductor region 13 has the upper surface 13a and the first side surface 13b positioned on one side of the upper surface 13a in the gate width direction of the gate electrode 15. The gate electrode 15 includes the first portion 151 facing the upper surface 13a via the gate insulating film 17, and the second portion 152 facing the first side surface 13b via the gate insulating film 17. The gate insulating film 17 includes the first film portion 171 positioned between the upper surface 13a and the first portion 151, and the second film portion 172 positioned between the first side surface 13b and the second portion 152. The film thickness of the second film portion 172 is smaller in a portion thereof farther from the upper surface 13a than in a portion thereof closer to the upper surface 13a. For example, the film thickness of the second film portion 172 decreases as the distance from the upper surface 13a increases.

In accordance with this, by reducing the thickness of the second film portion 172, the lower part of the channel in contact with the second film portion 172 is affected by the potential of the gate electrode 15, so that the potential of the lower part of the channel easily rises and the current easily flows. This allows the MOS transistor Tr to cause a current to more uniformly flow across the channel. Since the effective transistor size increases by expanding the range in which a current flows in the channel, the MOS transistor Tr is capable of improving the mutual conductance gm and improving the gate controllability.

Further, by reducing the thickness of the second film portion 172, since the potential of the lower part of the channel easily rises as a whole, it is possible to reduce the interfacial electron density. As a result, the MOS transistor Tr is capable of reducing the noise caused by the interfacial electron density and improving the noise properties.

Further, in the semiconductor apparatus 1 according to the first embodiment of the present disclosure, the semiconductor region 13 further includes the second side surface 13c positioned on the other side of the upper surface 13a in the gate width direction. The gate electrode 15 further includes the third portion 153 facing the second side surface 13c via the gate insulating film 17. The gate insulating film 17 further includes the third film portion 173 positioned between the second side surface 13c and the third portion 153. The film thickness of the third film portion 173 is smaller in a portion thereof farther from the upper surface 13a than in a portion thereof closer to the upper surface 13a. For example, the film thickness of the third film portion 173 decreases as the distance from the upper surface 13a increases.

In accordance with this, also the potential of the lower part of the channel in contact with the third film portion 173 easily rises and the current easily flows. As a result, since the effective transistor size further increases, the MOS transistor Tr is capable of further improving the mutual conductance gm and further improving the gate controllability. Further, since also the interfacial electron density in the lower part of the channel in contact with the third film portion 173 can be reduced, the MOS transistor Tr is capable of further improving the noise properties.

Second Embodiment

Figure 11:
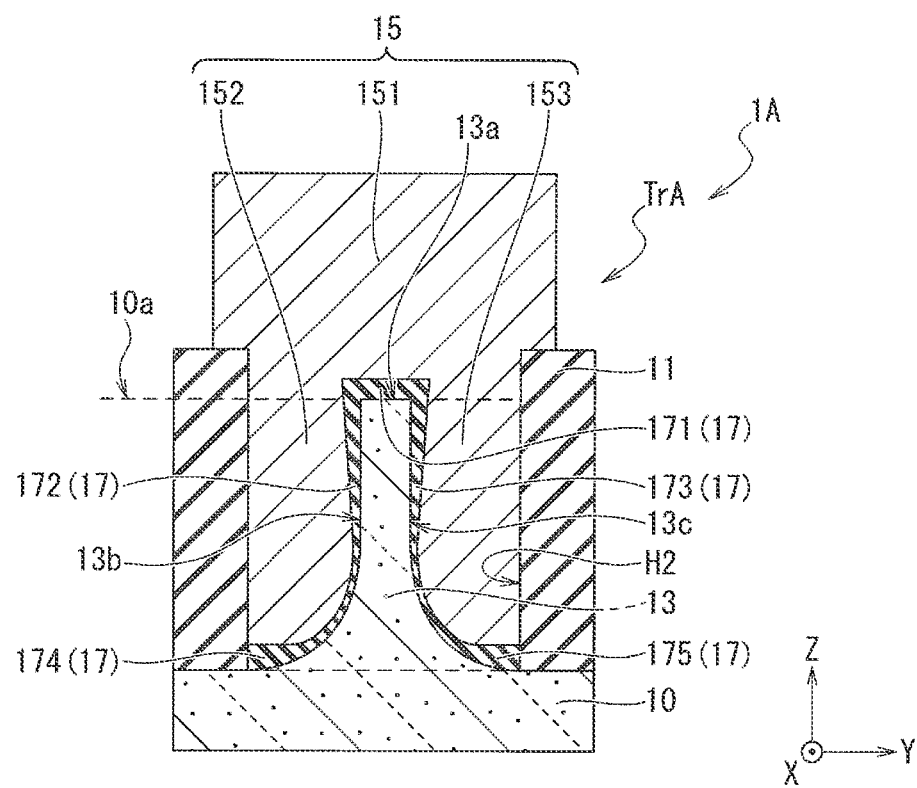
FIG. 11 is a cross-sectional view showing a configuration example of a semiconductor apparatus according to the second embodiment of the present disclosure.

FIG. 11 is a cross-sectional view showing a configuration example of a semiconductor apparatus 1A according to the second embodiment of the present disclosure. As shown in FIG. 11, the semiconductor apparatus 1A according to the second embodiment includes the semiconductor substrate 10 and a MOS transistor TrA (an example of a "field-effect transistor" according to the present disclosure) provided on the side of the surface 10a of the semiconductor substrate 10. In the semiconductor apparatus 1A, the film thickness of the gate insulating film 17 of the MOS transistor TrA decreases toward the lower part of the trench H2 and the insulation film becomes thicker at the bottom of the trench H2.

For example, the semiconductor apparatus 1A includes a first insulating thick film portion 174 disposed between the semiconductor substrate 10 and the second portion 152 of the gate electrode 15 in the Z-axis direction, and a second insulating thick film portion 175 disposed between the semiconductor substrate 10 and the third portion 153 of the gate electrode 15 in the Z-axis direction. The first insulating thick film portion 174 has a film thickness larger than that of the second film portion 172. The second insulating thick film portion 175 has a film thickness larger than that of the third film portion 173.

For example, the first insulating thick film portion 174 and the second insulating thick film portion 175 may each be part of the gate insulating film 17. The first insulating thick film portion 174 and the second insulating thick film portion 175 may be formed at the bottom of the trench H2 using a directional method of depositing an insulation film such as laser CVD (or a directional oxidation method). The first film portion 171, the second film portion 172, and the third film portion 173 of the gate insulating film 17 may be formed by forming the first insulating thick film portion 174 and the second insulating thick film portion 175 and then performing thermal oxidation treatment thereon. Through such processes, the second film portion 172 is formed to be integrated with the first insulating thick film portion 174 and the third film portion 173 is formed to be integrated with the second insulating thick film portion 175.

Since the semiconductor apparatus 1A according to the second embodiment of the present disclosure has the configuration of the semiconductor apparatus 1 according to the first embodiment, it exhibits effects similar to those in the first embodiment.

Further, the semiconductor apparatus 1A includes the first insulating thick film portion 174 and thus is capable of reducing the capacitance between the second portion 152 of the gate electrode 15 and the semiconductor substrate 10 and improving the insulation reliability between the second portion 152 and the semiconductor substrate 10. Similarly, the semiconductor apparatus 1A includes the second insulating thick film portion 175 and thus is capable of reducing the capacitance between the third portion 153 of the gate electrode 15 and the semiconductor substrate 10 and improving the insulation reliability between the third portion 153 and the semiconductor substrate 10.

Third Embodiment

In an embodiment of the present disclosure, at least one of the MOS transistors Tr or TrA described above may be applied to an imaging device.

Configuration Example of Entire Imaging Device

Figure 12:
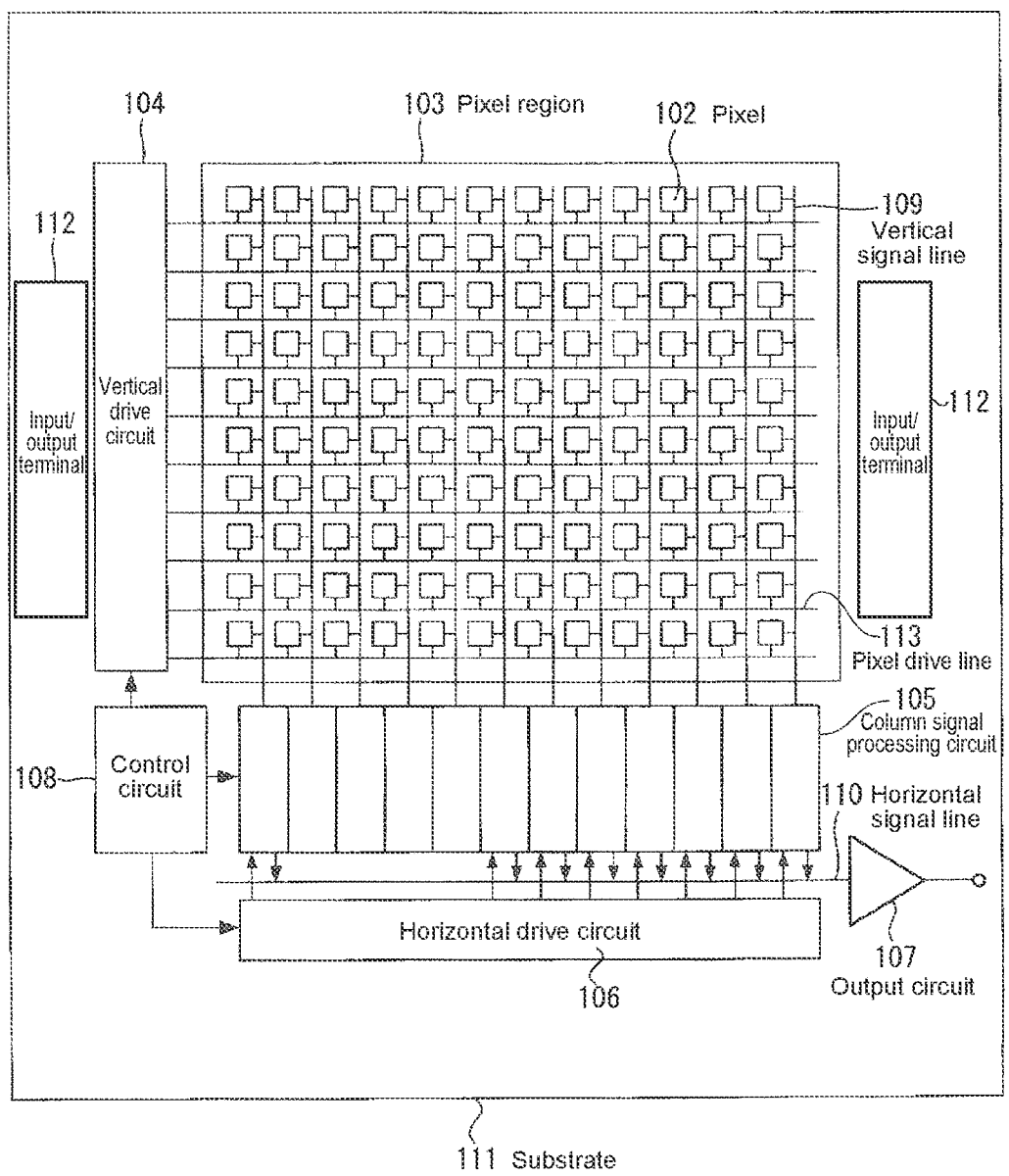
FIG. 12 is a diagram showing a configuration example of an imaging device according to an embodiment of the present disclosure.

FIG. 12 is a diagram showing a configuration example of an imaging device 100 according to the embodiment of the present disclosure. The imaging device 100 shown in FIG. 12 is, for example, a CMOS solid-state imaging device. As shown in FIG. 12, the imaging device 100 includes, on a substrate 111, a pixel region (so-called imaging region) 103 in which sensor pixels 102 including a plurality of photoelectric conversion devices are regularly and two-dimensionally arranged, and a peripheral circuit unit. The sensor pixel 102 includes a photodiode as a photoelectric conversion device and a plurality of pixel transistors (so-called MOS transistor). The plurality of pixel transistors may include three transistors, i.e., a transfer transistor, a reset transistor, and an amplifier transistor. The plurality of pixel transistors may include four transistors, i.e., a selection transistor in addition to the three transistors. Since the equivalent circuit of the unit pixel is the same as the usual one, detailed description thereof is omitted.

The sensor pixels 102 may have a shared pixel structure. The shared pixel structure includes a plurality of photodiodes, a plurality of transfer transistors, one shared floating diffusion, and another shared pixel transistor(s). That is, in the shared pixel structure, the photodiodes and the transfer transistors constituting a plurality of unit pixels are configured to share another pixel transistor(s) excluding the transfer transistors.

The peripheral circuit unit includes a vertical drive circuit 104, a column signal processing circuit 105, a horizontal drive circuit 106, an output circuit 107, a control circuit 108, and the like.

The control circuit 108 receives an input clock and data for instructing an operation mode and the like and outputs data such as internal information of the imaging device. That is, the control circuit 108 generates, on the basis of a vertical synchronization signal, a horizontal synchronization signal, and a master clock, clock signals and control signals that serve as a reference for the operations of the vertical drive circuit 104, the column signal processing circuit 105, the horizontal drive circuit 106, and the like. Then, the control circuit 108 inputs these signals to the vertical drive circuit 104, the column signal processing circuit 105, the horizontal drive circuit 106, and the like.

The vertical drive circuit 104 includes, for example, a shift register, selects a pixel drive line 113, supplies pulses for driving pixels to the selected pixel drive line 113, and drives the pixels row by row. That is, the vertical drive circuit 104 sequentially selects and scans the sensor pixels 102 of the pixel region 103 in the vertical direction row by row, and supplies a pixel signal based on the signal charges generated in accordance with the amount of received light in the photoelectric conversion device of each of the sensor pixels 102 to the column signal processing circuit 105 via a vertical signal line 109.

The column signal processing circuit 105 is disposed, for example, for each column of the sensor pixel 102 and performs, for each pixel column, signal processing such as noise removal on signals output from the sensor pixels 102 in one row. That is, the column signal processing circuit 105 performs signal processing such as CDS for removing fixed pattern noise unique to the sensor pixel 102, signal amplification, and AD conversion. A horizontal selection switch (not shown) is provided in the output stage of the column signal processing circuit 105 and connected between the output stage and the horizontal signal line 110.

The horizontal drive circuit 106 includes, for example, a shift register, sequentially outputs a horizontal scanning pulse to select each of the column signal processing circuits 105 in order, and causes each of the column signal processing circuits 105 to output a pixel signal to the horizontal signal line 110.

The output circuit 107 performs signal processing on the signals sequentially supplied from each of the column signal processing circuits 105 via the horizontal signal line 110 and outputs the signals. For example, the output circuit 107 performs only buffering or performs black level adjustment, column variation correction, various types of digital signal processing, or the like in some cases. An input/output terminal 112 exchanges signals with the outside.

Configuration Example of Pixel

Figure 13:
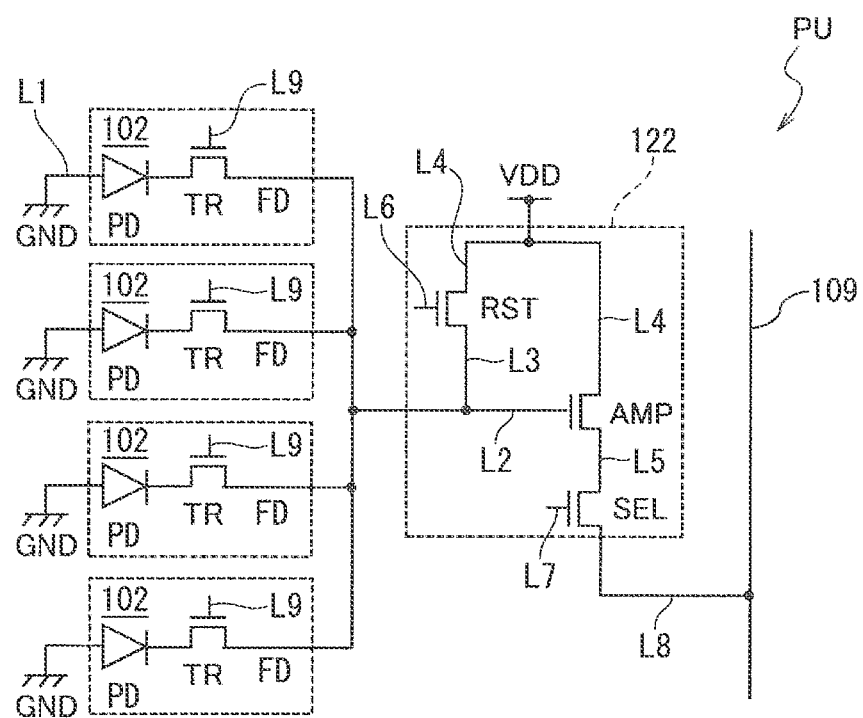
FIG. 13 is a circuit diagram showing a configuration example of a pixel unit according to the first embodiment of the present disclosure.

FIG. 13 is a circuit diagram showing a configuration example of a pixel unit PU according to the first embodiment of the present disclosure. The imaging device 100 may ha a pixel sharing structure. For example, as shown in FIG. 13, in the imaging device 100, four sensor pixels 102 may be electrically connected to one readout circuit 122 to form one pixel unit PU. The four sensor pixels 102 share the one readout circuit 122 and the output of each of the four sensor pixels 102 is input to the shared readout circuit 122. Each of the sensor pixels 102 includes components common to each other.

Each of the sensor pixels 102 includes, for example, a photodiode PD (an example of a photoelectric conversion device), a transfer transistor TR electrically connected to the photodiode PD, and a floating diffusion FD temporarily holds charges output from the photodiode PD via the transfer transistor TR. The photodiode PD performs photoelectric conversion to generate charges according to the amount of received light. The cathode of the photodiode PD is electrically connected to the source region of the transfer transistor TR, and the anode of the photodiode PD is electrically connected to a reference potential line (e.g., ground). The drain region of the transfer transistor TR is electrically connected to the floating diffusion FD, and the gate electrode of the transfer transistor TR is electrically connected to the pixel drive line 113. The transfer transistor TR is, for example, a CMOS (Complementary Metal Oxide Semiconductor) transistor.

The floating diffusions FD of the sensor pixels 102 sharing the one readout circuit 122 are electrically connected to each other and electrically connected to the input terminal of the shared readout circuit 122. The readout circuit 122 includes, for example, an amplifier transistor AMP, a reset transistor RST, and a selection transistor SEL. Note that the selection transistor SEL may be omitted as necessary.

The source region of the reset transistor RST (input terminal of the readout circuit 122) is electrically connected to the floating diffusion FD, and the drain region of the reset transistor RST is electrically connected to a power supply line VDD and the drain region of the amplifier transistor AMP. The gate electrode of the reset transistor RST is electrically connected to the pixel drive line 113 (see FIG. 12). The source region of the amplifier transistor AMP is electrically connected to the drain region of the selection transistor SEL, and the gate electrode of the amplifier transistor AMP is electrically connected to the source region of the reset transistor RST. The source region of the selection transistor SEL (output terminal of the readout circuit 122) is electrically connected to the vertical signal line 109, and the gate electrode of the selection transistor SEL is electrically connected to the pixel drive line 113 (see FIG. 12).

The transfer transistor TR transfers the charges of the photodiode PD to the floating diffusion FD when turning on in accordance with the control signal supplied to the gate electrode. The floating diffusion FD temporarily holds the charges output from the photodiode PD via the transfer transistor TR. The reset transistor RST resets the potential of the floating diffusion FD to a predetermined potential. When the reset transistor RST turns on, the potential of the floating diffusion FD is reset to the potential of the power supply line VDD.

The amplifier transistor AMP generates, as a pixel signal, a signal of a voltage corresponding to the level of the charges held in the floating diffusion FD. The amplifier transistor AMP constitutes a source-follower amplifier and outputs a pixel signal of a voltage corresponding to the level of the charges generated in the photodiode PD. The amplifier transistor AMP amplifies, when the selection transistor SEL is turned on, the potential of the floating diffusion FD and outputs a voltage corresponding to the potential to the column signal processing circuit 105 via the vertical signal line 109.

The selection transistor SEL controls the output timing of the pixel signal from the readout circuit 122. That is, a pixel signal of a voltage corresponding to the level of the charges held in the floating diffusion FD can be output while the selection transistor SEL is in the ON-state.

One or more of the transfer transistor TR, the reset transistor RST, the amplifier transistor AMP, and the selection transistor SEL include the MOS transistor Tr described in the first embodiment or the MOS transistor TrA described in the second embodiment.

Configuration Example of Pixel Unit

Figure 14:
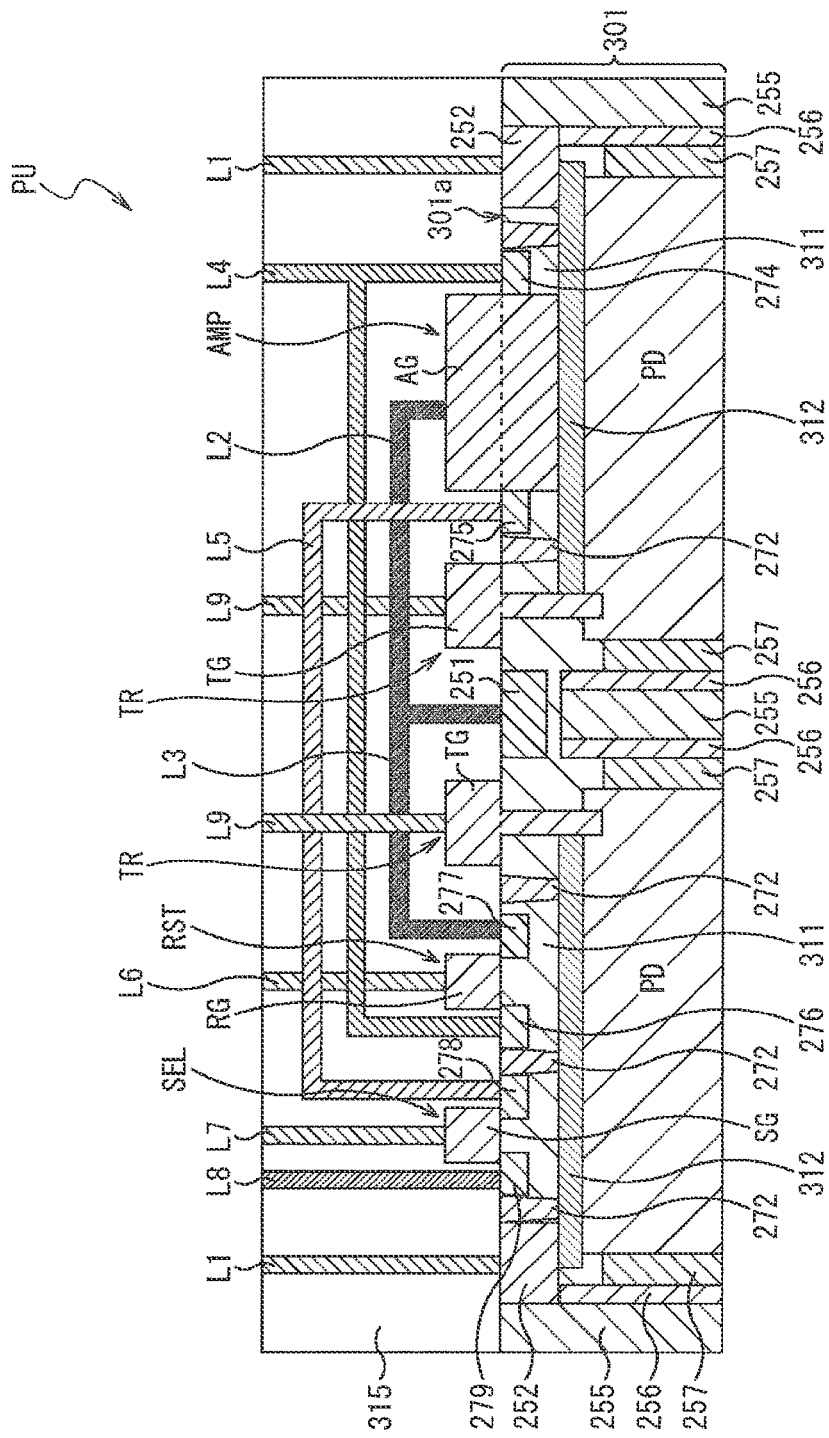
FIG. 14 is a cross-sectional view showing a configuration example of a pixel unit according to a third embodiment of the present disclosure.

FIG. 14 is a cross-sectional view showing a configuration example of the pixel unit PU according to the third embodiment of the present disclosure. Note that the cross-sectional view shown in FIG. 14 is merely a schematic diagram and is not intended to strictly and correctly show the actual structure. The cross-sectional view shown in FIG. 14 includes portions where the positions of a transistor and an impurity diffusion layer in the horizontal direction are intentionally changed in order to describe the configuration of the pixel unit PU included in the imaging device 100 in an easy-to-understand manner on paper. The actual disposition of the pixel unit PU is shown in more accurately in FIG. 15 described below.

As shown in FIG. 14, the imaging device 100 includes a semiconductor substrate 301. The semiconductor substrate 301 is, for example, a silicon substrate. The semiconductor substrate 301 constitutes at least part of the substrate 111 shown in FIG. 12. The p⁻-type well layer 311 is provided in part of a surface 301a of the semiconductor substrate 301 and the vicinity thereof. Further, the p-type well layer 312 having a concentration of p-type impurity higher than that of the well layer 311 and the photodiode PD including an n-type impurity diffusion layer are provided in a region deeper than the p⁻-type well layer 311 (lower region in FIG. 16).

A channel of the pixel transistor such as the amplifier transistor AMP, the selection transistor SEL, and the reset transistor RST is formed in the p⁻-type well layer 311. The p-type well layer 312 is positioned below the channels of these pixel transistors. In the examples shown in FIG. 14 and FIG. 16 described below, the p⁻-type well layer 311 is an example of a "semiconductor region" according to the present disclosure and the p-type well layer 312 is an example of an "impurity diffusion layer" according to the present disclosure.

The p-type well layer 312 is interposed between the p⁻-type well layer 311 and the photodiode PD and covers the surface of the photodiode PD. The p-type well layer 312 may function as an HAD (Hole Accumulation Diode) layer. As a result, the photodiode PD is capable of suppressing generation of a dark current even in the case where crystal defects occur on the surface 301a of the semiconductor substrate 301 and electrons are likely to escape through the crystal defects.

The back surface side of the semiconductor substrate 301 opposite to the side of the surface 301a is a light incident surface. A color filter and an on-chip lens are provided on the back surface side of the semiconductor substrate 301. Each of the color filter and the on-chip lens is provided, for example, for each of the sensor pixels 102.

Pixel transistors such as the amplifier transistor AMP, the reset transistor RST, the selection transistor SEL, and the transfer transistor TR are provided on the side of the surface 301a of the semiconductor substrate 301.

The transfer transistor TR is provided on the side of the surface 301a of the semiconductor substrate 301 for each of the sensor pixels 102. The source region of the transfer transistor TR is an n⁺-type layer 251. The n⁺-type layer 251 provided for each of the sensor pixels 102 is electrically connected via a wire L2 to constitute the floating diffusion FD.

A gate electrode TG of the transfer transistor TR extends from the surface 301a of the semiconductor substrate 301 through the p⁻-type well layer 311 to have a depth reaching the photodiode PD. A reference potential (e.g., a ground potential: 0 V) is supplied to a p⁺-type layer 252 that is a contact portion between the p⁻-type well layer 311 and the p-type well layer 312 via a wire L1. As a result, the potential of each of the p⁻-type well layer 311 and the p-type well layer 312 is set to the reference potential.

A pixel separation layer 255 for electrically separating adjacent sensor pixels 102 from each other is provided in the semiconductor substrate 301. The pixel separation layer 255 has, for example, a DTI (Deep Trench Isolation) structure and extends in the depth direction of the semiconductor substrate 301. The pixel separation layer 255 is formed of, for example, silicon oxide. Further, in the semiconductor substrate 301, a p-type layer 256 and an n-type layer 257 are provided between the pixel separation layer 255 and the photodiode PD. The p-type layer 256 is formed on the side of the pixel separation layer 255, and the n-type layer 257 is formed on the side of the photodiode PD.

A device isolation layer 272 is provided on the side of the surface 301a of the semiconductor substrate 301. The device isolation layer 272 electrically isolates each of the amplifier transistor AMP, the transfer transistor TR, the reset transistor RST, the selection transistor SEL, and the p⁺-type layer 252 that is a contact portion from other devices. The device isolation layer 272 has, for example, an STI(Shallow Trench Isolation) structure.

The amplifier transistor AMP includes a gate electrode AG, an n⁺-type layer 274 as a drain region, and an n⁺-type layer 275 as a source region. The gate electrode AG of the amplifier transistor AMP has a structure in which part of the gate electrode AG is buried from the surface 301a of the semiconductor substrate 301 in the depth direction.

The reset transistor RST includes a gate electrode RG, an n⁺-type layer 276 as a drain region, and an n⁺-type layer 277 as a source region. The selection transistor SEL includes a gate electrode SG, an n⁺-type layer 278 as a drain region, and an n⁺-type layer 279 as a source region.

The gate electrode AG of the amplifier transistor AMP is connected, via the wire L2, to the n⁺type layer 251 provided for each of the sensor pixel 102 provided in the semiconductor substrate 301. Further, the gate electrode AG of the amplifier transistor AMP is connected, via a wire L3, also to the n+-type layer 277 that is the source region of the reset transistor RST. The n+-type layer 251 and the n+-type layer 277 that is the source region of the reset transistor RST, including the wires L2 and L3, of each of the sensor pixels 102 constitute the floating diffusion FD.

The n+-type layer 274 that is the drain region of the amplifier transistor AMP and the n+-type layer 276 that is the drain region of the reset transistor RST are connected to each other via a wire L4. A predetermined power supply voltage is supplied to the n+-type layer 274 and the n+-type layer 276 via the wire L4.

The n+-type layer 275 that is the source region of the amplifier transistor AMP and the n+type layer 278 that is the drain region of the selection transistor SEL are connected to each other via a wire L5.

The gate electrode RG of the reset transistor RST is connected to the pixel drive line 113 via a wire L6, and a drive signal for controlling the reset transistor RST is supplied from the vertical drive circuit 104.

The gate electrode SG of the selection transistor SEL is connected to the pixel drive line 113 (see FIG. 12) via a wire L7. A drive signal for controlling the selection transistor SEL is supplied from the vertical drive circuit 104 (see FIG. 12) to the gate electrode SG of the selection transistor SEL via the pixel drive line 113 and the wire L7. The n+-type layer 279 that is the source region of the selection transistor SEL is connected to the vertical signal line 109 (see FIG. 12 and FIG. 13) via a wire L8. A pixel signal of a voltage corresponding to the charges held in the floating diffusion FD is output from the n+-type layer 279 that is the source region of the selection transistor SEL to the vertical signal line 109 via the wire L8.

The gate electrode TG of the transfer transistor TR is connected to the pixel drive line 113 via a wire L9. A drive signal for controlling the transfer transistor TR is supplied from the vertical drive circuit 104 to the gate electrode TG of the transfer transistor TR via the pixel drive line 113 and the wire L9.

The upper surface of the pixel transistor such as the amplifier transistor AMP, the reset transistor RST, the selection transistor SEL, and the transfer transistor TR is covered by an interlayer insulating film 315. The interlayer insulating film 315 is, for example, a film obtained by stacking one or two or more of SiO, SiN, SiON, and SiCN.

As the materials of the wire L1 to the wire L9, an arbitrary metal material may be selected. For example, a portion extending upward of the semiconductor substrate 301 may be formed of tungsten (W) and a portion extending in a direction (e.g., horizontal direction) orthogonal to the upward direction may be formed of copper (Cu) or a Cu alloy containing Cu as the main constituent.

In the pixel unit PU shown in FIG. 14, the amplifier transistor AMP includes the MOS transistor Tr described in the first embodiment or the MOS transistor TrA described in the second embodiment.

Figure 15:
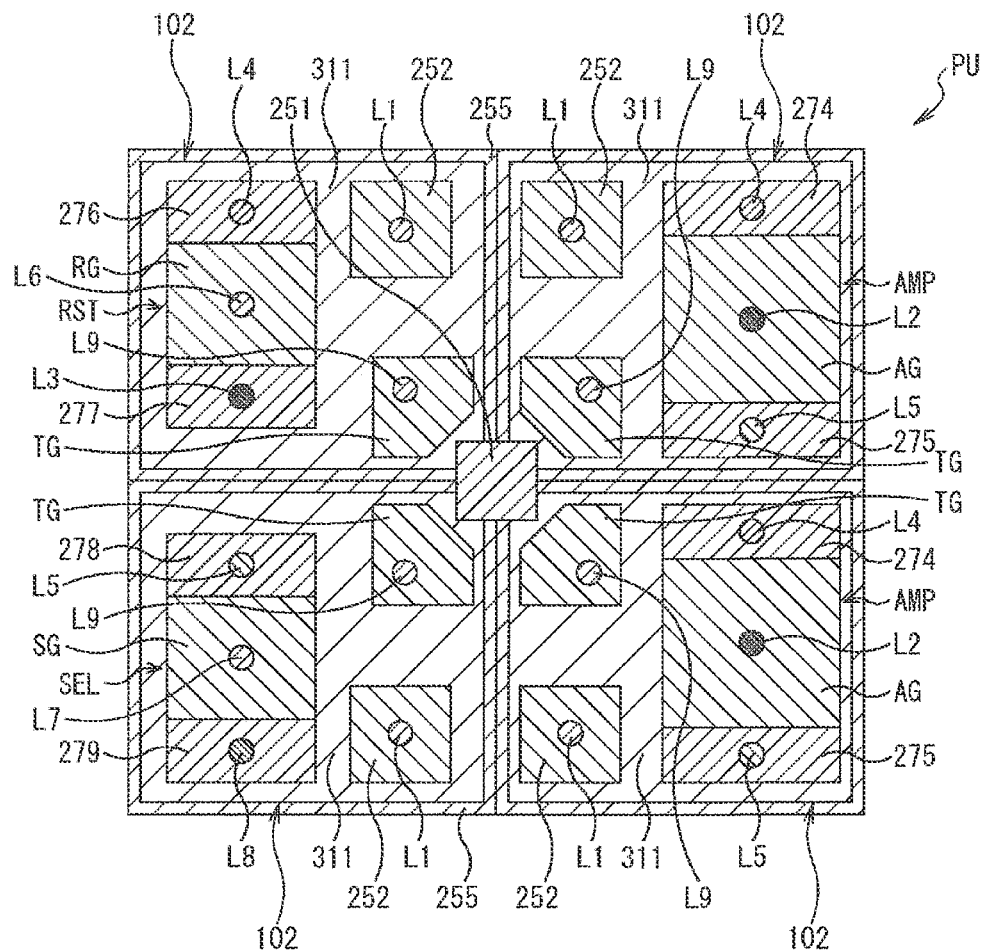
FIG. 15 is a plan view showing a configuration example of the pixel unit according to the third embodiment of the present disclosure.

FIG. 15 is a plan view showing a configuration example of the pixel unit PU according to the third embodiment of the present disclosure. FIG. 15 shows a v configuration example of the pixel unit PU at the position (depth) of the surface 301a of the semiconductor substrate 301.

One pixel unit PU includes, for example, a total of four sensor pixels, i.e., two sensor pixels arranged in each of the lateral direction (e.g., the X-axis direction) and the longitudinal direction (e.g., the Y-axis) in plan view. The n+-type layer 251 as the floating diffusion FD shared by the four sensor pixels 102 is disposed in the center of the pixel unit PU. The transfer transistor TR is disposed in the vicinity of the floating diffusion FD of each of the sensor pixels 102.

Of the four sensor pixels 102 constituting one pixel unit PU, the reset transistor RST is disposed in one sensor pixel 102, the selection transistor SEL is disposed in another sensor pixel 102, and the amplifier transistors AMP are disposed in the remaining two sensor pixels 102. The two amplifier transistors AMP are connected to each other in parallel. For example, of the two amplifier transistors AMP, the gate electrodes AG are connected to each other via the wire L2, the n+-type layers 274 that are the drain regions are connected to each other via the wire L4, and the n+-type layers 275 that are the source regions are connected to each other via the wire L5, thereby operating as one amplifier transistor AMP.

As described above, in the imaging device 100 according to the third embodiment of the present disclosure, the amplifier transistor AMP included in the pixel unit PU includes the MOS transistor Tr described in the first embodiment or the MOS transistor TrA described in the second embodiment. In accordance with this, the mutual conductance gm of the amplifier transistor AMP and the noise properties can be improved, and thus, it is possible to increase the operation speed and reduce noise of the imaging device 100.

Fourth Embodiment

Figure 16:
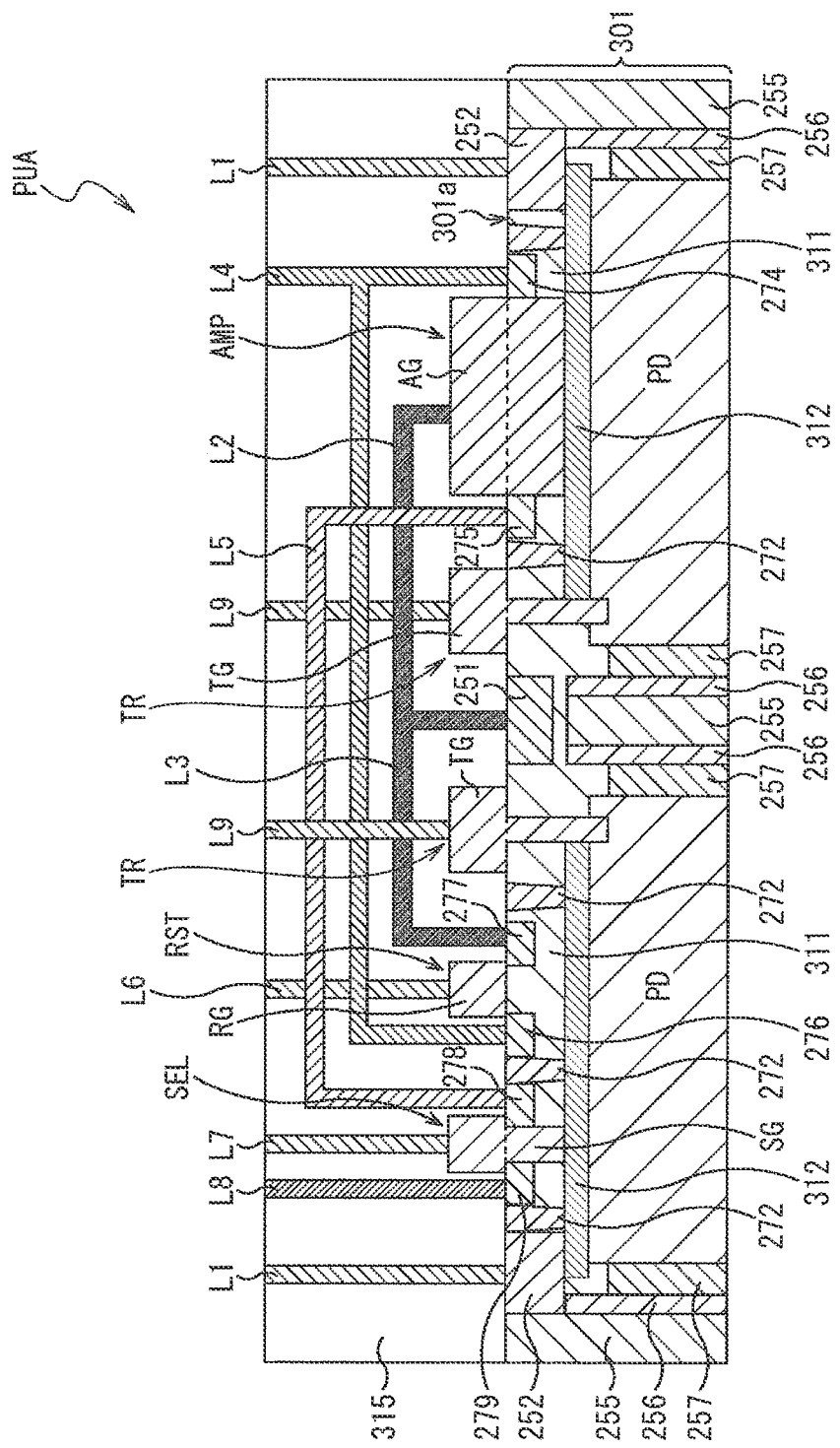
FIG. 16 is a cross-sectional view showing a configuration example of a pixel unit according to a fourth embodiment of the present disclosure.

FIG. 16 is a cross-sectional view showing a configuration example of a pixel unit PUA according to a fourth embodiment of the present disclosure. Note that the cross-sectional view shown in FIG. 16 is merely a schematic diagram, similarly to the cross-sectional view shown in FIG. 14. The cross-sectional view shown in FIG. 16 includes portions where the positions of a transistor and an impurity diffusion layer in the horizontal direction are intentionally changed in order to describe the configuration of the pixel unit PUA included in the imaging device 100 in an easy-to-understand manner on paper.

In the pixel unit PUA shown in FIG. 16, each of the amplifier transistor AMP and the selection transistor SEL includes the MOS transistor Tr or the MOS transistor TrA. The configuration of the pixel unit PUA other than the above is the same as that of the pixel unit PU according to the third embodiment.

In accordance with this, the mutual conductance gm of the amplifier transistor AMP and the selection transistor SEL and the noise properties can be improved, and thus, it is possible to increase the operation speed and reduce noise of the imaging device 100.

Fifth Embodiment

Figure 17:
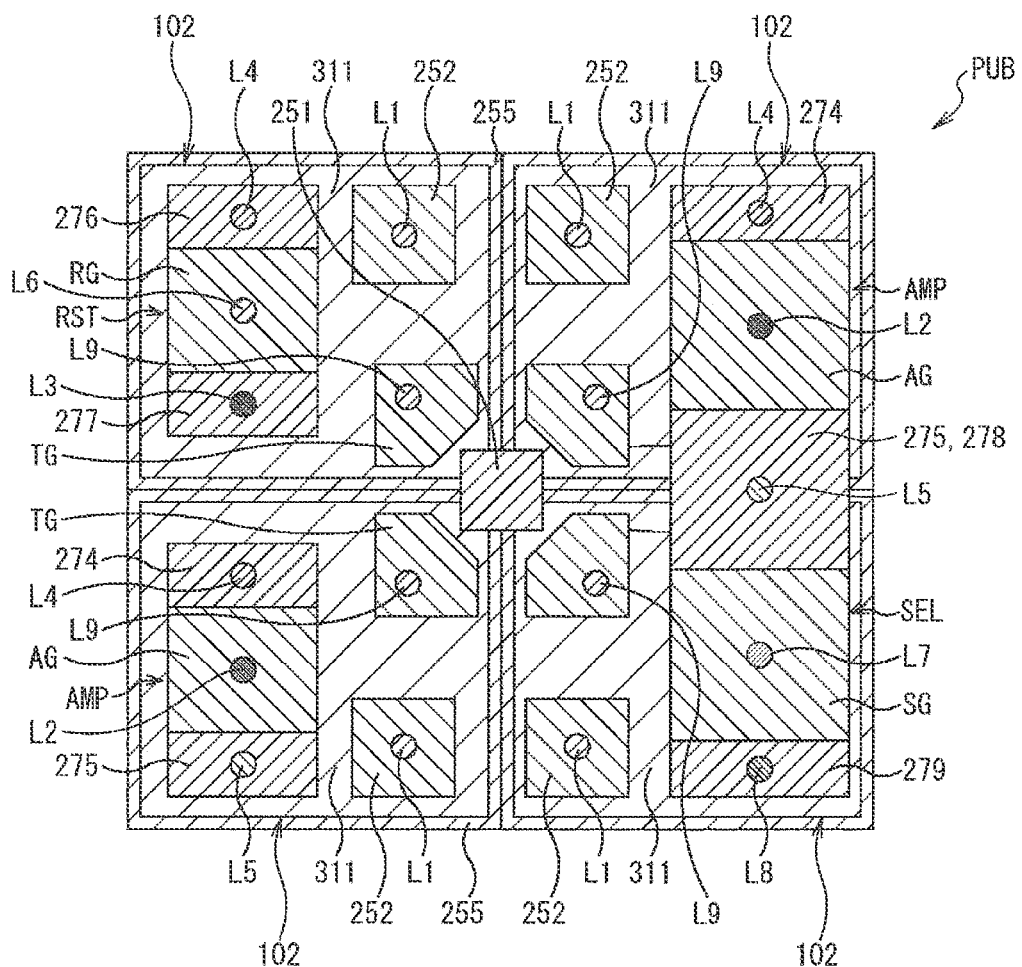
FIG. 17 is a plan view showing a configuration example of a pixel unit according to a fifth embodiment of the present disclosure.
Figure 18:
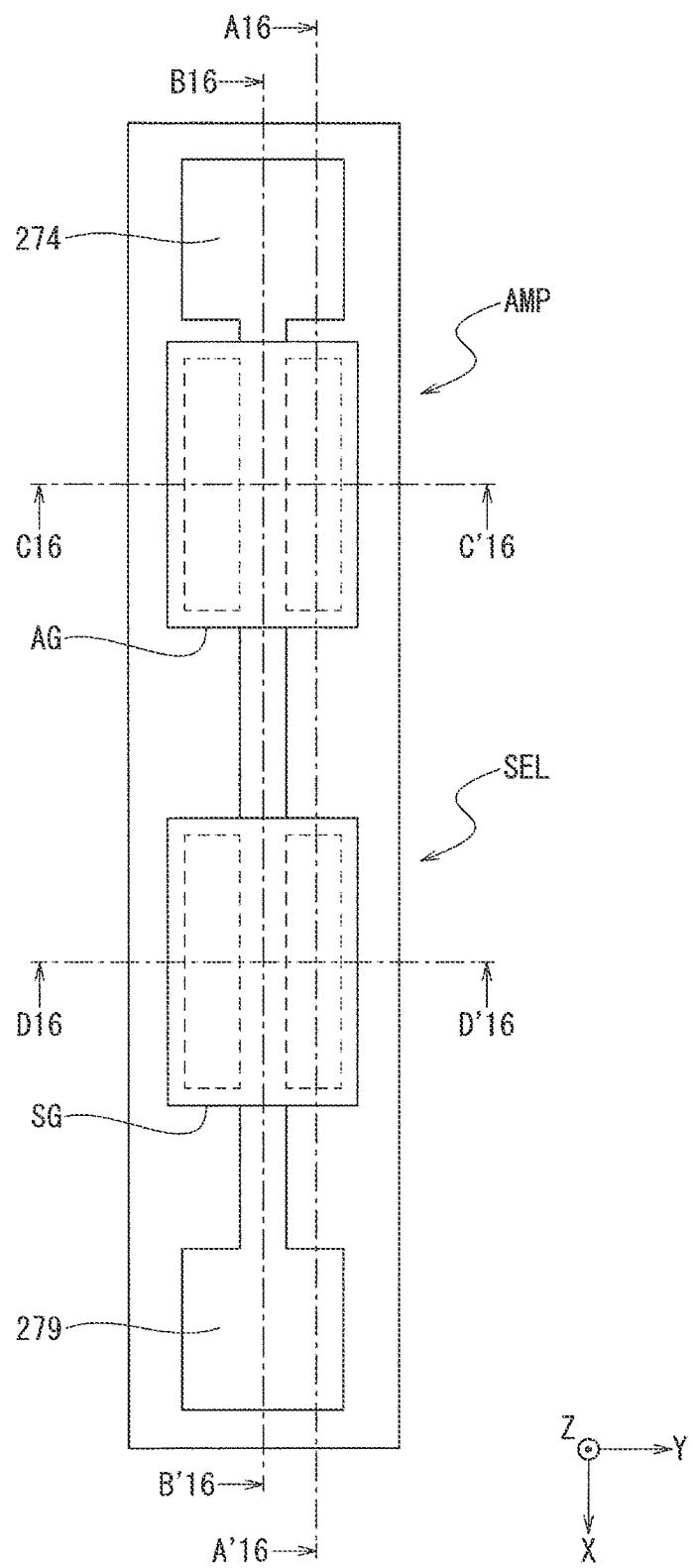
FIG. 18 is a plan view showing a configuration example of an amplifier transistor and a selection transistor included in the pixel unit according to the fifth embodiment of the present disclosure.
Figure 19:
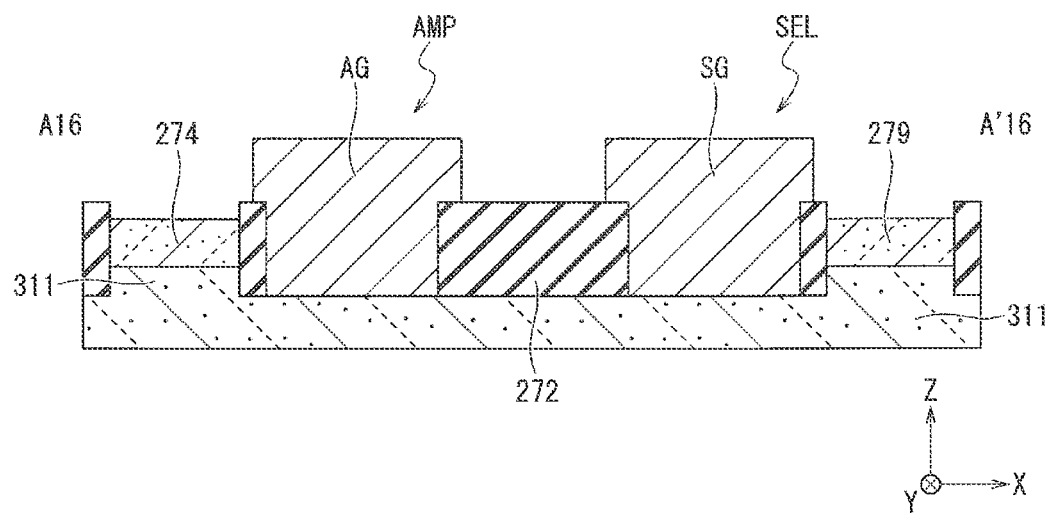
FIG. 19 is a cross-sectional view showing a configuration example of the amplifier transistor and the selection transistor included in the pixel unit according to the fifth embodiment of the present disclosure.
Figure 20:
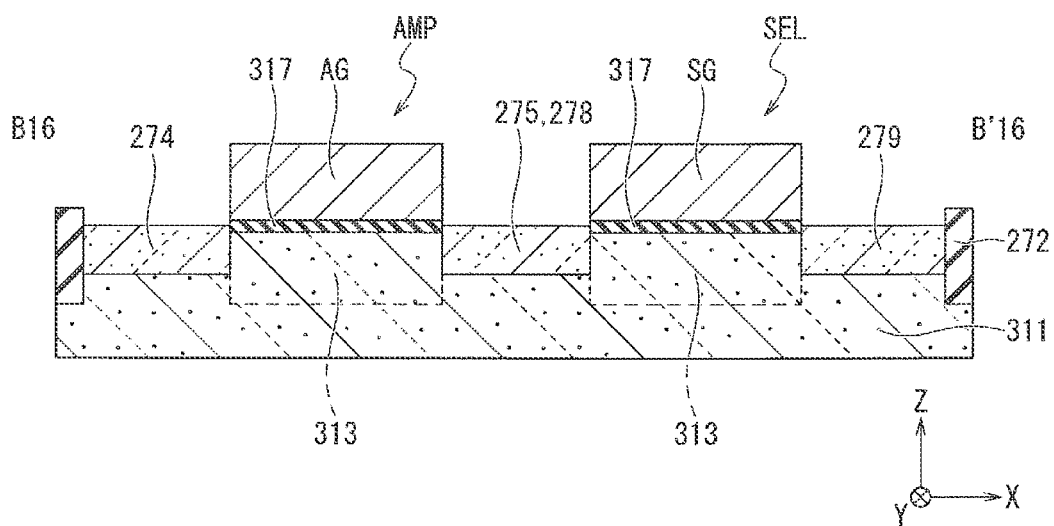
FIG. 20 is a cross-sectional view showing a configuration example of the amplifier transistor and the selection transistor included in the pixel unit according to the fifth embodiment of the present disclosure.

FIG. 17 is a plan view showing a configuration example of a pixel unit PUB according to the fifth embodiment of the present disclosure. FIG. 18 is a plan view showing a configuration example of the amplifier transistor AMP and the selection transistor SEL included in the pixel unit PUB according to the fifth embodiment of the present disclosure. FIG. 19 and FIG. 20 are each a cross-sectional view showing a configuration example of the amplifier transistor AMP and the selection transistor SEL included in the pixel unit PUB according to the fifth embodiment of the present disclosure. FIG. 19 shows the cross section of FIG. 18 taken along the line A16-A'16 parallel to the X-axis direction. FIG. 20 shows the cross section of FIG. 18 taken along the line B16-B'16 parallel to the X-axis direction.

Further, the shapes of the gate electrode AG, a channel region 313, and a gate insulating film 317 in the cross section of the amplifier transistor AMP shown in FIG. 18 taken along the line C16-C'16 parallel to the Y-axis direction are the same as the shapes of the gate electrode 15, the channel region 13, and the gate insulating film 17 shown in FIG. 4 or FIG. 11. Similarly, the shapes of the gate electrode SG, the channel region 313, and the gate insulating film 317 in the cross section of the selection transistor SEL shown in FIG. 18 taken along the line D16-D'16 parallel to the Y-axis direction are the same as the shapes of the gate electrode 15, the channel region 13, and the gate insulating film 17 shown in FIG. 4 or FIG. 11.

In the pixel unit PUA shown in FIG. 16, the n$^+$-type layer 275 that is the source region of the amplifier transistor AMP and the n$^+$-type layer 278 that is the drain region of the selection transistor SEL are shared. For example, as shown in FIG. 17, in the case where one pixel unit PUB includes two amplifier transistors AMP connected to each other in parallel, the n$^+$-type layer 275 that is the source region of one of the two amplifier transistors AMP and the n$^+$-type layer 278 that is the drain region of the selection transistor SEL include one n$^+$-type impurity diffusion layer. The n$^+$-type layer 275 that is the source region of the other of the two amplifier transistors AMP is connected, via the wire L5, to the one impurity diffusion layer in which the n$^+$-type layers 275 and 278 are shared.

The configuration of the pixel unit PUB other than the above is the same as that of the pixel unit PU according to the third embodiment.

In accordance with this, similarly to the fourth embodiment, the mutual conductance gm of the amplifier transistor AMP and the selection transistor SEL and the noise properties can be improved, it is possible to increase the operation speed and reduce noise of the imaging device 100. Further, since the source region of the amplifier transistor AMP and the drain region of the selection transistor SEL can be shared, it is possible to improve the layout efficiency.

Sixth Embodiment

In the imaging device 100 according to the embodiment of the present disclosure, the gate electrode may include both a FinFET including a fin portion and a planar MOS transistor. Further, the thickness of the gate insulating film of the FinFET and the thickness of the gate insulating film of the planar MOS transistor may be different from each other.

Figure 21:
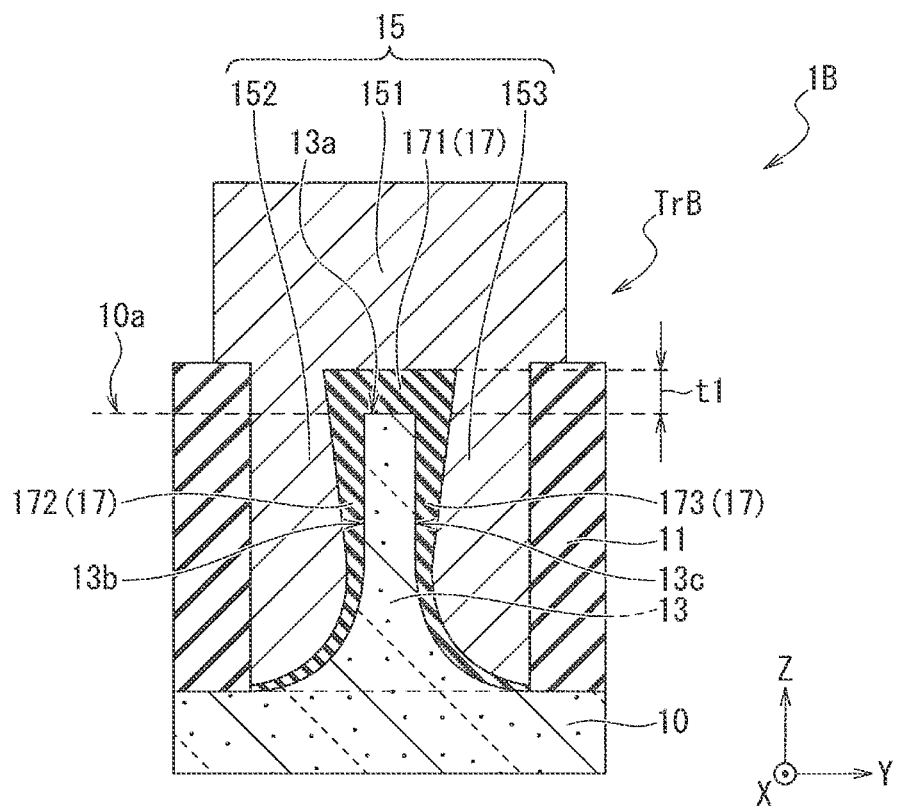
FIG. 21 is a cross-sectional view showing a configuration example 1 of a MOS transistor included in a semiconductor apparatus according to a sixth embodiment of the present disclosure.
Figure 22:
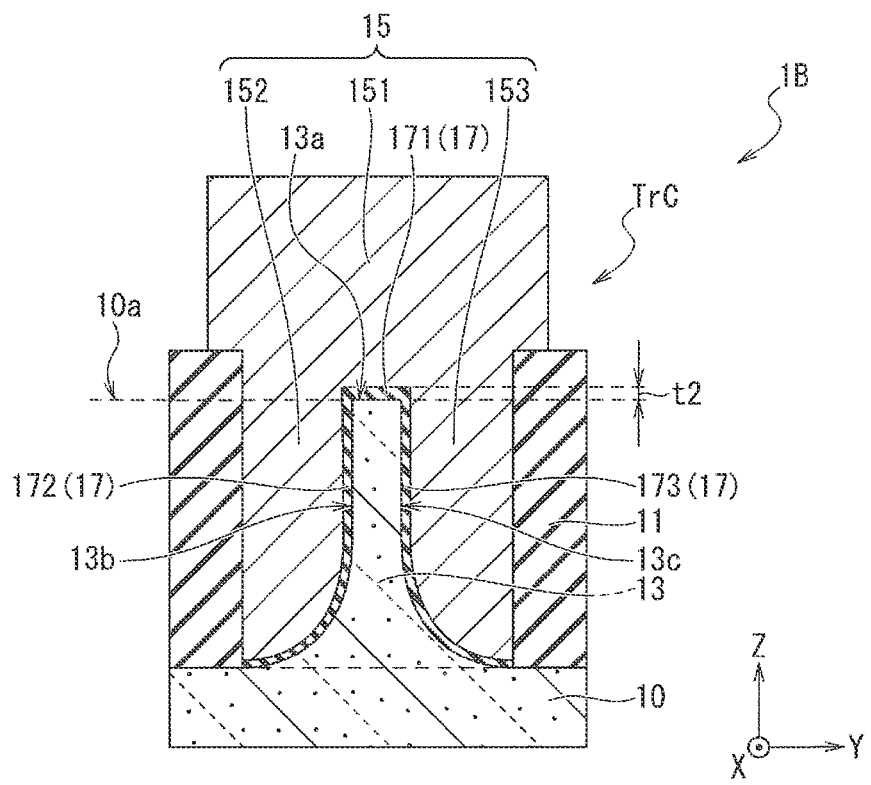
FIG. 22 is a cross-sectional view showing a configuration example 2 of the MOS transistor included in the semiconductor apparatus according to the sixth embodiment of the present disclosure.
Figure 23:
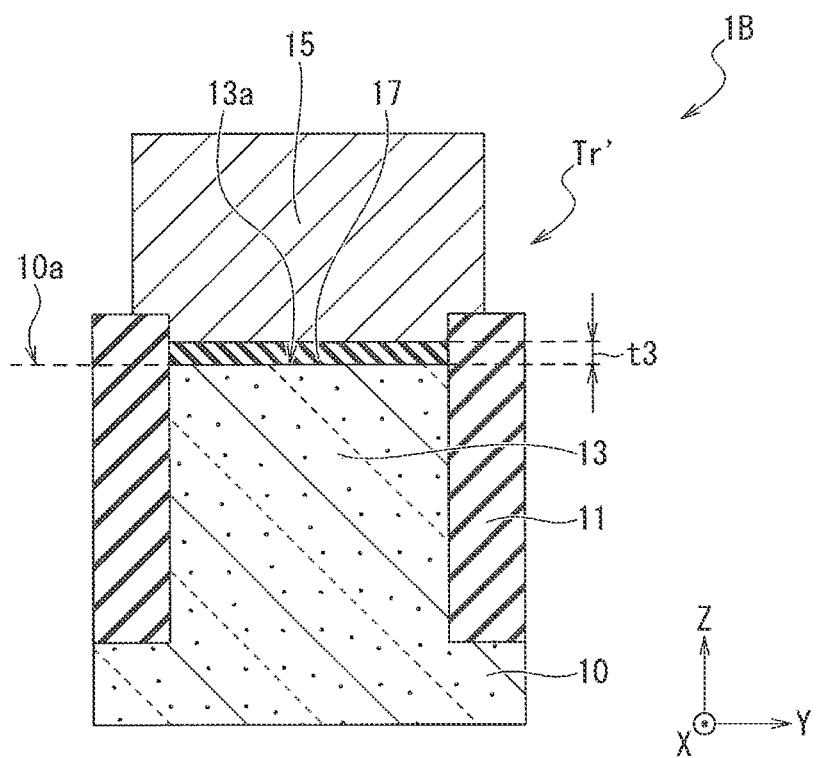
FIG. 23 is a cross-sectional view showing a configuration example of a planar MOS transistor included in the semiconductor apparatus according to the sixth embodiment of the present disclosure.

FIG. 21 is a cross-sectional view showing a configuration example (configuration example 1) of a MOS transistor TrB included in a semiconductor apparatus 1B according to a sixth embodiment of the present disclosure. FIG. 22 is a cross-sectional view showing a configuration example (configuration example 2) of a MOS transistor TrC included in the semiconductor apparatus 1B according to the sixth embodiment of the present disclosure. Both the MOS transistors TrB and TrC are examples of a "field-effect transistor" according to the present disclosure. FIG. 23 is a cross-sectional view showing a configuration example of a planar MOS transistor Tr' included in the semiconductor apparatus 1B according to the sixth embodiment of the present disclosure. The planar MOS transistor Tr' is an example of a "planar field-effect transistor" according to the present disclosure. The planar type may be rephrased as a surface-channel type. FIG. 21 to FIG. 23 each show the cross section of the MOS transistor taken along the Y-Z plane parallel to the gate width direction, as in the cross section shown in FIG. 4, for example.

As shown in FIG. 21 and FIG. 22, the MOS transistors TrB and TrC are each a FinFET. As shown in FIG. 23, the planar MOS transistor Tr' does not include a fin portion. In the planar MOS transistor Tr', the gate insulating film 17 is formed to be flat on the upper surface 13a on the flat semiconductor region 13, and the gate electrode 15 is formed to be flat on the flat gate insulating film 17. In the planar MOS transistor Tr', the gate insulating film 17 and the gate electrode 15 are formed in parallel to the upper surface 13a of the semiconductor region 13.

As shown in FIG. 21, the film thickness of the gate insulating film 17 formed on the upper surface 13a of the semiconductor region 13 in the MOS transistor TrB is defined as t1. As shown in FIG. 22, the film thickness of the gate insulating film 17 formed on the upper surface 13a of the semiconductor region 13 in the MOS transistor TrC is defined as t2. As shown in FIG. 23, the film thickness of the gate insulating film 17 formed on the upper surface 13a of the semiconductor region 13 in the MOS transistor TrC is defined as t3. The magnitude relationship between the film thicknesses t1, t2, and t3 satisfies a relationship of t1>t3>t2.

In the FinFET, the electric field tends to concentrate on a portion of the gate insulating film 17 positioned on the upper surface 13a of the semiconductor region 13 because voltages are applied thereto from three directions of the upward direction and side directions, and dielectric breakdown occurs more easily than other portions of the gate insulating film 17 in some cases. In the MOS transistor TrB in FIG. 21, since a portion of the gate insulating film 17 where the electric field tends to concentrate is thicker than the gate insulating film 17 of the planar MOS transistor Tr', it is possible to suppress dielectric breakdown of the gate insulating film 17 and improve the reliability of the gate insulating film 17. Further, since the capacitance generated between the gate electrode 15 and the semiconductor region 13 can be reduced, it is possible to improve the conversion efficiency of the signal of the voltage applied to the gate electrode 15.

Further, in the MOS transistor TrC shown in FIG. 23, since the film thickness of the gate insulating film 17 is smaller than that of the gate insulating film 17 of the planar MOS transistor Tr', it is possible to reduce the threshold voltage (Vth) and reduce the on-resistance (Ron). As a result, the MOS transistor TrC is capable of improving the operation speed and reducing the power consumption.

The semiconductor apparatus 1B according to the sixth embodiment may include both the MOS transistor TrB and the planar MOS transistor Tr' in which the thickness of the gate insulating film 17 is smaller than that in the MOS transistor TrB. Alternatively, the semiconductor apparatus 1B may include both the MOS transistor TrC and the planar MOS transistor Tr' in which the thickness of the gate insulating film 17 is smaller than that in the MOS transistor TrC. Alternatively, the semiconductor apparatus 1B may include all of the MOS transistor TrB, the MOS transistor TrC, and the planar MOS transistor Tr'.

Seventh Embodiment

In the embodiment of the present disclosure, the MOS transistor TrB shown in FIG. 21 may be applied to the amplifier transistor AMP of the readout circuit 122 (see FIG. 13). Further, the planar MOS transistor Tr' shown in FIG. 23 may be applied to the selection transistor SEL and the reset transistor RST of the readout circuit 122. In this case, the configuration of the pixel unit included in the imaging device 100 (see FIG. 12) is the same as the configuration shown in FIG. 14 and FIG. 15, for example.

In a seventh embodiment, since the MOS transistor TrB shown in FIG. 21 is applied to the amplifier transistor AMP, it is possible to improve the reliability of the gate insulating film in the amplifier transistor AMP. Further, since the capacitance generated between the gate electrode AG of the amplifier transistor AMP and the semiconductor substrate 301 can be reduced, it is possible to improve the conversion efficiency of the signal of the voltage applied to the gate electrode AG. Since the conversion efficiency of the amplifier transistor AMP is improved, it is possible to reduce the noise in the readout circuit 122.

Eighth Embodiment

In the embodiment of the present disclosure, the MOS transistor TrB shown in FIG. 21 may be applied to the amplifier transistor AMP and the selection transistor SEL of the readout circuit 122 (see FIG. 13). Further, the planar MOS transistor Tr' shown in FIG. 23 may be applied to the reset transistor RST of the readout circuit 122. In this case, the configuration of the pixel unit included in the imaging device 100 (see FIG. 12) is the same as the configuration shown in FIG. 15 and the configuration shown in FIG. 16, for example, in a plan view and a cross-sectional view, respectively.

In an eighth embodiment, similarly to the seventh embodiment, the MOS transistor TrB shown in FIG. 21 is applied to the amplifier transistor AMP. As a result, the effects similar to those in the seventh embodiment are exhibited, e.g., the reliability of the gate insulating film in the amplifier transistor AMP is improved. Further, since the MOS transistor TrB shown in FIG. 21 is applied not only to the amplifier transistor AMP but also to the selection transistor SEL, it is possible to improve also the reliability of the gate insulating film in the selection transistor SEL.

Note that in the eighth embodiment, the MOS transistor Tr shown in FIG. 1 to FIG. 4 or the MOS transistor TrC shown in FIG. 22 may be applied to the selection transistor SEL. As a result, the selection transistor SEL is capable of reducing the threshold voltage (Vth) and reducing the on-resistance (Ron) as compared with the amplifier transistor AMP. The configuration of the pixel unit in this case is also the same as the configuration shown in FIG. 16, for example.

Ninth Embodiment

In the embodiment of the present disclosure, the MOS transistor TrB shown in FIG. 22 may be applied to the amplifier transistor AMP, the selection transistor SEL, and the reset transistor RST of the readout circuit 122 (see FIG. 13). In this case, the configuration of the pixel unit included in the imaging device 100 (see FIG. 12) is the same as the configuration shown in FIG. 15 and the configuration shown in FIG. 24, for example, in a plan view and a cross-sectional view, respectively.

Figure 24:
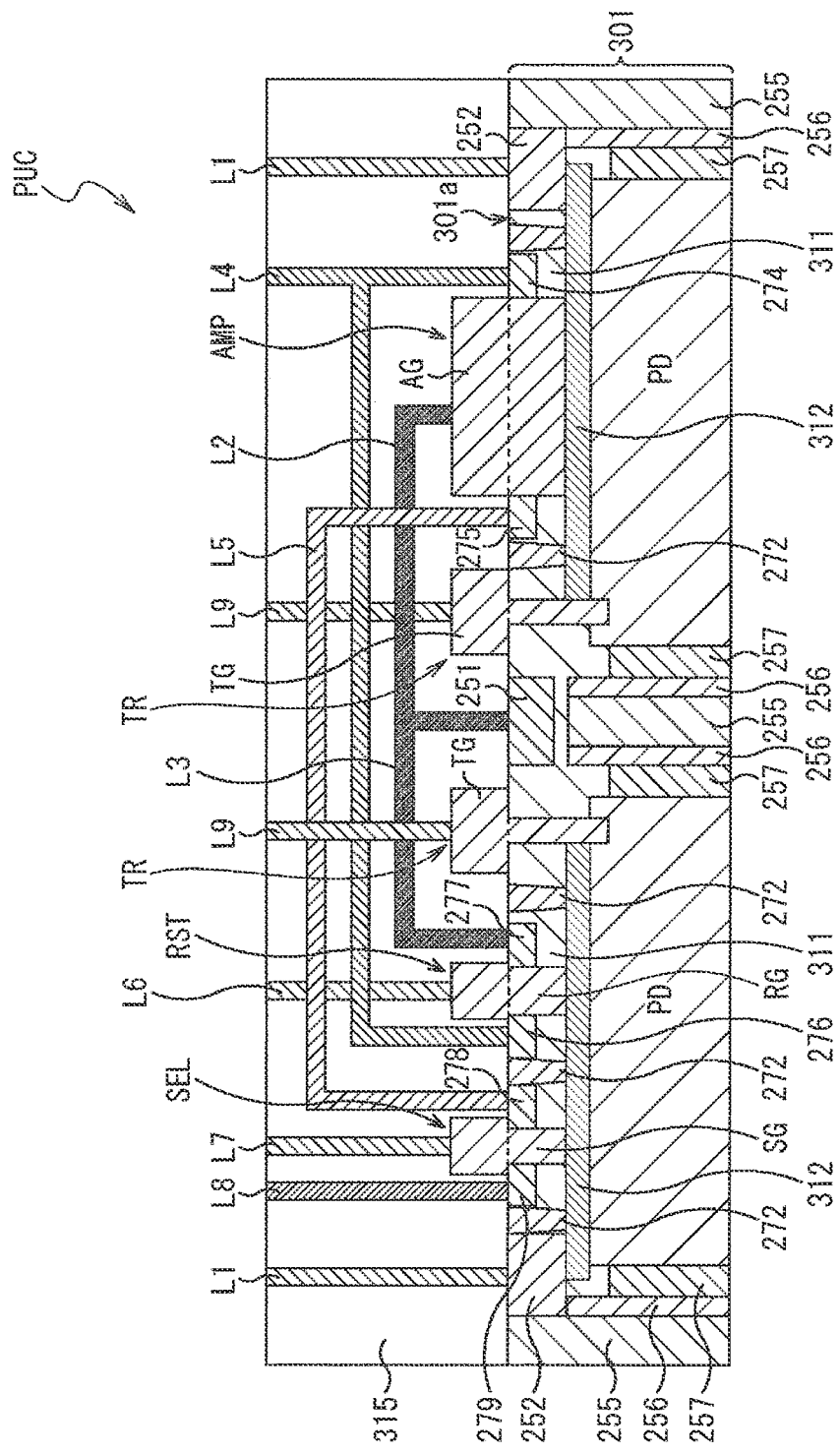
FIG. 24 is a cross-sectional view showing a configuration example of a pixel unit according to a ninth embodiment of the present disclosure.

FIG. 24 is a cross-sectional view showing a configuration example of a pixel unit PUC according to a ninth embodiment of the present disclosure. Note that the cross-sectional view shown in FIG. 24 is merely a schematic diagram, similarly to the cross-sectional view shown in FIG. 14 and FIG. 16. The cross-sectional view shown in FIG. 24 includes portions where the positions of a transistor and an impurity diffusion layer in the horizontal direction are intentionally changed in order to describe the configuration of the pixel unit PUC included in the imaging device 100 in an easy-to-understand manner on paper.

In the pixel unit PUC shown in FIG. 24, each of the amplifier transistor AMP, the selection transistor SEL, and the reset transistor RST includes the MOS transistor TrB shown in FIG. 21. The configuration of the pixel unit PUC other than the above is the same as that of the pixel unit PU according to the third embodiment.

In the ninth embodiment, similarly to the seventh embodiment, the MOS transistor TrB shown in FIG. 21 is applied to the amplifier transistor AMP. As a result, the effects similar to those in the seventh embodiment are exhibited, e.g., the reliability of the gate insulating film in the amplifier transistor AMP is improved. Further, the MOS transistor TrB shown in FIG. 21 is applied not only to the amplifier transistor AMP but also to the selection transistor SEL and the reset transistor RST. As a result, it is possible to improve the reliability of the gate insulating film in the selection transistor SEL and the reset transistor RST.

Note that in the ninth embodiment, the MOS transistor Tr shown in FIG. 1 to FIG. 4 or the MOS transistor TrC shown in FIG. 22 may be applied to at least one of the selection transistor SEL or the reset transistor RST. As a result, at least one of the selection transistor SEL or the reset transistor RST is capable of reducing the threshold voltage (Vth) and reducing the on-resistance (Ron) as compared with the amplifier transistor AMP. The configuration of the pixel unit PUC in this case is also the same as the configuration shown in FIG. 15 and FIG. 24, for example.

Tenth Embodiment

In the imaging device 100 according to the embodiment of the present disclosure, the pixel unit may be of conversion-efficiency switching type. In this case, the pixel unit includes a conversion efficiency switch and a floating capacitor connected to the conversion efficiency switch. In the embodiment of the present disclosure, the MOS transistor TrB shown in FIG. 22 may be applied to a conversion efficiency switch.

Figure 25:
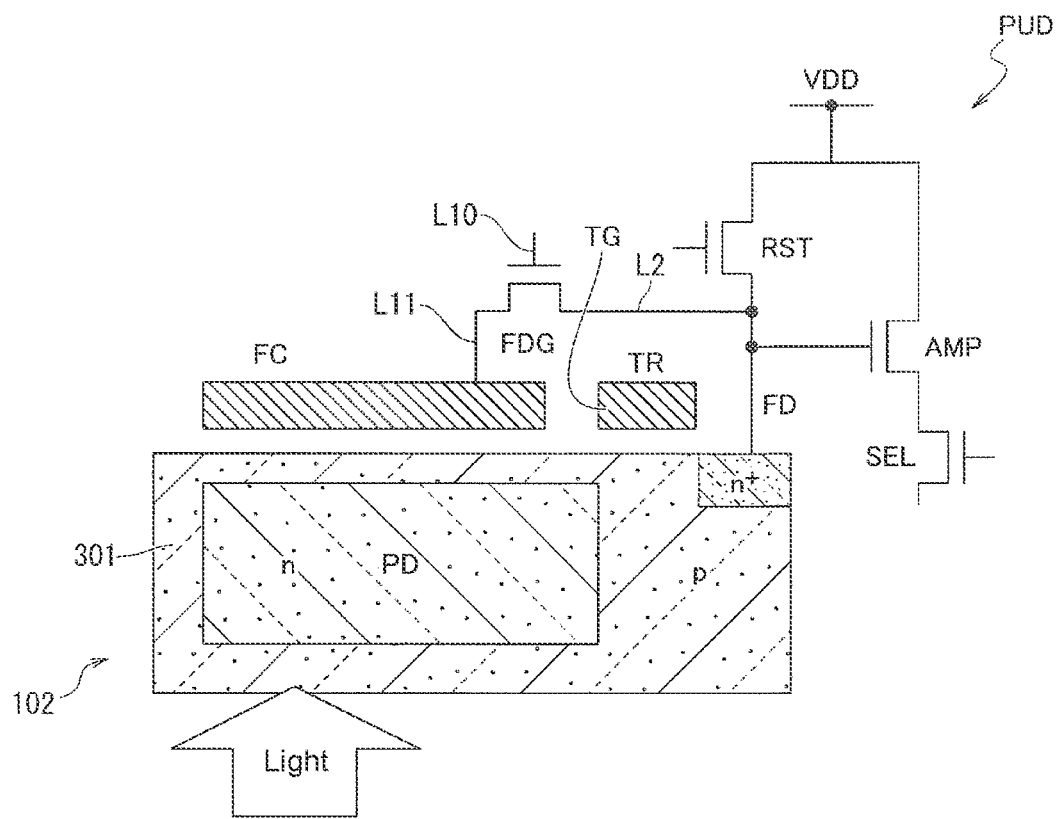
FIG. 25 is a diagram showing a configuration example of a pixel unit according to a tenth embodiment of the present disclosure.
Figure 26:
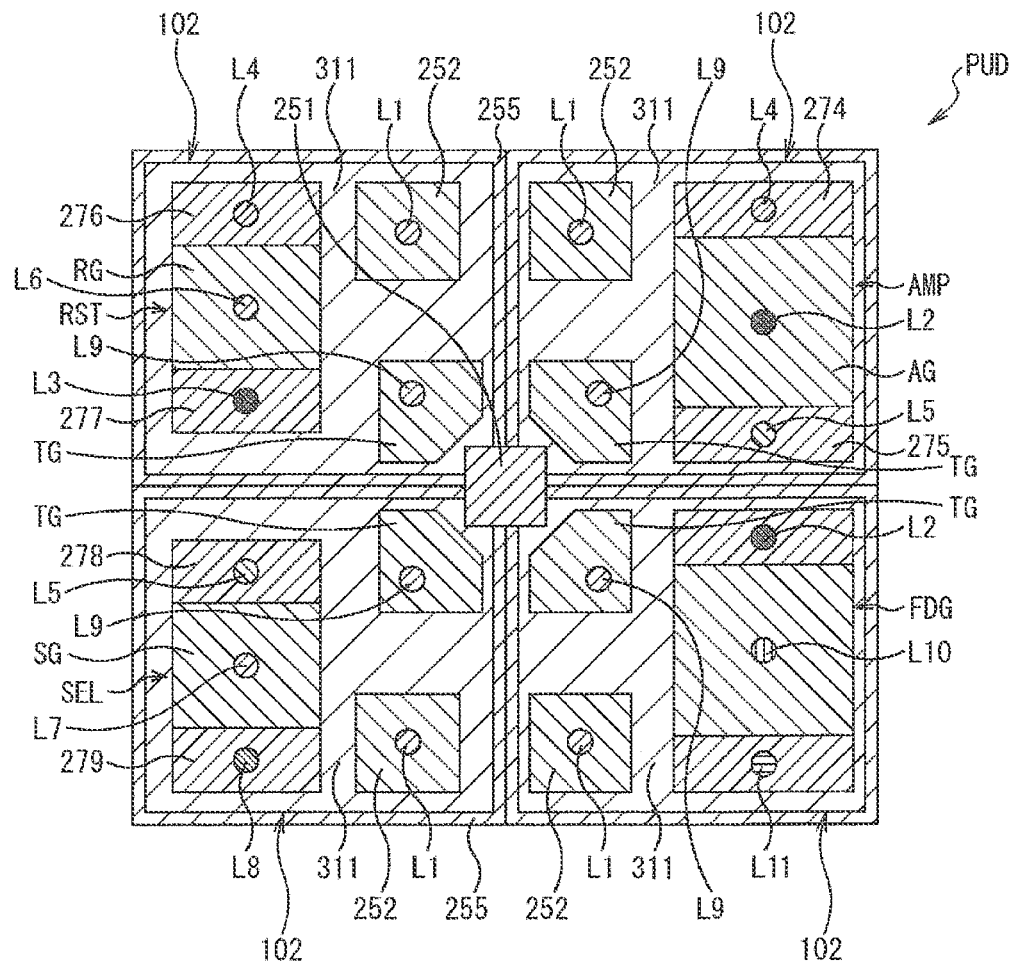
FIG. 26 is a plan view showing a configuration example of the pixel unit according to the tenth embodiment of the present disclosure.

FIG. 25 is a diagram showing a configuration example of a pixel unit PUD according to a tenth embodiment of the present disclosure. FIG. 25 is a diagram in which a cross-sectional view and a circuit diagram are combined in order to show a configuration example of the pixel unit PUD in an easy-to-understand manner. FIG. 26 is a plan view showing a configuration example of the pixel unit PUD according to the tenth embodiment of the present disclosure.

As shown in FIG. 25, the pixel unit PUD includes a conversion efficiency switch FDG and a floating capacitor FC. The floating capacitor FC is a MOS capacitor formed on the photodiode PD. The gate electrode of this MOS capacitor is connected to the conversion efficiency switch FDG.

The pixel unit PUD switches between low conversion efficiency and high conversion efficiency in accordance with, for example, the illuminance of a subject. This is performed by switching the capacitance of the floating diffusion FD by applying a control signal to the gate electrode of the conversion efficiency switch FDG via a wire L10 to turn on/off the conversion efficiency switch FDG.

For example, when the conversion efficiency switch FDG is turned on, the floating diffusion FD is connected to the floating capacitor FC (MOS capacitor) via the wire L2, the conversion efficiency switch FDG, and a wire L11, as shown in FIG. 25 and FIG. 26. As a result, the capacitance of the floating diffusion FD increases and the conversion efficiency of the amplifier transistor AMP decreases. That is, the conversion efficiency becomes low.

Further, when the conversion efficiency switch FDG is turned off, the floating diffusion FD is electrically separated from the floating capacitor FC (MOS capacitor). As a result, the capacitance of the floating diffusion FD decreases and the conversion efficiency of the amplifier transistor AMP increases. That is, the conversion efficiency becomes high.

In the tenth embodiment, similarly to the seventh embodiment, the MOS transistor TrB shown in FIG. 21 is applied to the amplifier transistor AMP. As a result, the effects similar to those in the seventh embodiment are exhibited, e.g., the reliability of the gate insulating film in the amplifier transistor AMP is improved. Further, the MOS transistor TrB shown in FIG. 21 is applied not only to the amplifier transistor AMP but also to the selection transistor SEL, the reset transistor RST, and the conversion efficiency switch FDG. As a result, it is possible to improve the reliability of the gate insulating film in the selection transistor SEL, the reset transistor RST, and the conversion efficiency switch FDG.

Note that in the tenth embodiment, the MOS transistor Tr shown in FIG. 1 to FIG. 4 or the MOS transistor TrC shown in FIG. 22 may be applied to one or more of the selection transistor SEL, the reset transistor RST, and the conversion efficiency switch FDG. As a result, one or more of the selection transistor SEL, the reset transistor RST, and the conversion efficiency switch FDG are capable of reducing the threshold voltage (Vth) and reducing the on-resistance (Ron) as compared with the amplifier transistor AMP.

Other Embodiments

As described above, although the present disclosure has been described through embodiments and modified examples, the statements and drawings forming part of this disclosure should not be understood to limit the present disclosure. Various alternative embodiments, Examples, and operational technologies will become apparent to those skilled in the art from this disclosure. It goes without saying that the technology according to the present disclosure (the present technology) includes various embodiments and the like that are not described here.

For example, in the first and second embodiments described above, the case where the cross section of the semiconductor region 13 taken along the Y-Z plane has a shape that is long in the Y-axis direction in a portion on the lower side than a portion on the side of the upper surface 13a (i.e., the upper part) and the lower part is rounded, as shown in FIG. 4 and FIG. 11, has been described. However, in the present disclosure, the cross-sectional shape of the semiconductor region 13 is not limited thereto. In the embodiment of the present disclosure, the cross-sectional shape of the semiconductor region 13 may be rectangular and the upper part and the lower part of the semiconductor region 13 may have the same length in the Y-axis direction. Such a shape can be obtained by performing anisotropic etching on the semiconductor substrate 10 from the side of the surface 10a in Step ST1 in FIG. 5.

Further, although it has been described that four sensor pixels 102 constitute one shared pixel structure in the embodiment described above, the present technology is not limited thereto. In the present technology, the sensor pixel 102 does not necessarily need to have the shared pixel structure. Specifically, one sensor pixel 102 may include one photodiode, one transfer transistor, one floating diffusion, one reset transistor, and one amplifier transistor, and one selection transistor may be added thereto.

Further, in the above-mentioned imaging device 100, the MOS transistor TrB that is a FinFET shown in FIG. 21, the MOS transistor Tr shown in FIG. 1, or the MOS transistor TrC shown in FIG. 22 may be applied to the transfer transistor TR disposed inside the sensor pixel 102 and an out-of-pixel peripheral transistor disposed outside the sensor pixel 102. Further, the planar MOS transistor Tr' shown in FIG. 23 may be applied to the transfer transistor TR and the out-of-pixel peripheral transistor.

In the imaging device 100 according to the embodiment of the present disclosure, an example of application patterns of MOS transistors to the pixel unit and the like is shown in Table 1. Note that in Table 1, "fin type (thick)" means a FinFET in which the thickness of the gate insulating film is larger than that of the planar MOS transistor Tr' shown in FIG. 23, as in the MOS transistor TrB shown in FIG. 21. "Fin type (thin)" means a FinFET in which the thickness of the gate insulating film is smaller than that of the MOS transistor TrB shown in FIG. 21, as in the MOS transistor Tr shown in FIG. 1 to FIG. 4 or the MOS transistor TrC shown in FIG. 22. "Planar type" means a planar MOS transistor in which the thickness of the gate insulating film is smaller than that of the MOS transistor TrB shown in FIG. 21, as in the planar MOS transistor Tr' shown in FIG. 23. "Vertical type" means a MOS transistor having a structure in which the gate electrode extends from the surface of semiconductor substrate in the depth direction, as in the transfer transistor TR shown in FIG. 14, for example.

TABLE 1

| Case | AMP | SEL | RST | TG | FDG (Only conversion-efficiency switching type) | Out-of-pixel peripheral transistor |
|---|---|---|---|---|---|---|
| 1 | Fin type (thick) | Planar type | Planar type | Planar type, vertical type | Planar type | Fin type (thin), planar type |
| 2-1 | Fin type (thick) | Fin type (thin) | Planar type | Planar type, vertical type | Planar type | Fin type (thin), planar type |
| 2-2 | Fin type (thick) | Fin type (thick) | Planar type | Planar type, vertical type | Planar type | Fin type (thin), planar type |
| 3-1 | Fin type (thick) | Fin type (thin) | Fin type (thin) | Planar type, vertical type, fin type (thin) | Fin type (thin) | Fin type (thin), planar type |
| 3-2 | Fin type (thick) | Fin type (thick) | Fin type (thin) | Planar type, vertical type, fin type (thin) | Fin type (thin) | Fin type (thin), planar type |
| 3-3 | Fin type (thick) | Fin type (thick) | Fin type (thick) | Planar type, vertical type, fin type (thin) | Fin type (thin) | Fin type (thin), planar type |
| 3-4 | Fin type (thick) | Fin type (thick) | Fin type (thick) | Planar type, vertical type, fin type (thick) | Fin type (thick) | Fin type (thin), planar type |

Application Example to Image Sensor

Figure 27:
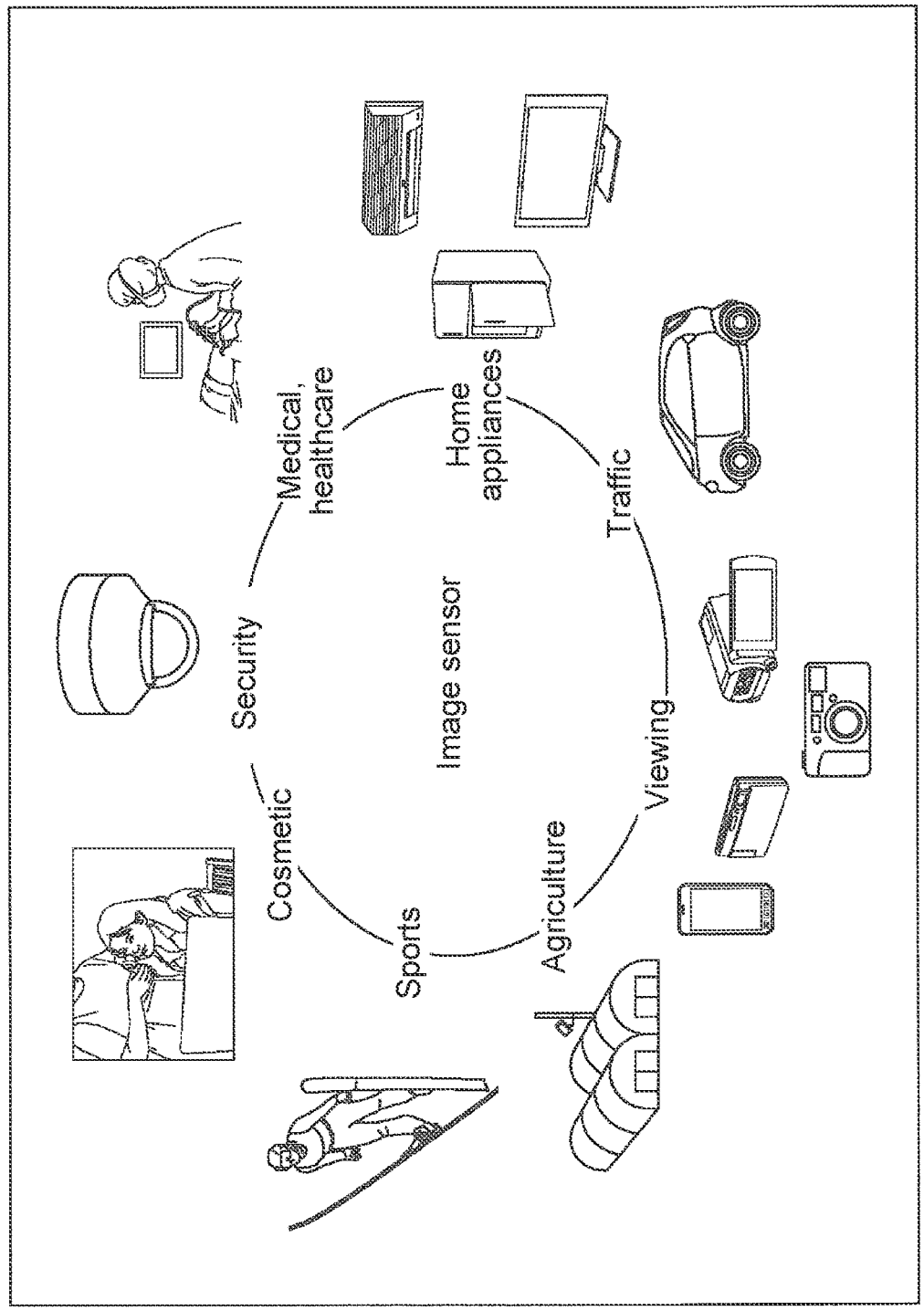
FIG. 27 is a diagram showing a usage example of an image sensor using the above-mentioned imaging device.

FIG. 27 is a diagram showing a usage example of an image sensor using the above-mentioned imaging device 100. The image sensor using the above-mentioned imaging device 100 can be used in, for example, in various cases for sensing light such as visible light, infrared light, ultraviolet light, and X-rays as follows.

- Apparatus for taking images used for viewing, such as a digital camera and a portable device with a camera function
- Apparatus used for traffic purposes such as an in-vehicle sensor for imaging the front, rear, surrounding, and interior of automobiles for safe driving such as automatic stopping or for recognizing the state of drivers, etc., a monitoring camera for monitoring traveling vehicles and roads, and a ranging sensor for ranging between vehicles, etc.
- Apparatus used in home appliances such as a TV, a refrigerator, and an air conditioner to image the gestures of users and perform device operations in accordance with the gestures
- Apparatus used for medical and healthcare purposes, such as an endoscope and an apparatus that performs angiography by receiving infrared light
- Apparatus used for security purposes, such as a monitoring camera for security purposes and a camera for personal identification purposes
- Apparatus used for cosmetic purposes, such as a skin measuring apparatus for imaging skin and a microscope for imaging scalp
- Apparatus used for sports purposes, such as an action camera for sports purposes and a wearable camera
- Apparatus used for agricultural purposes, such as a camera for monitoring the states of fields and crops

Application Example to Electronic Apparatus

The present technology does not necessarily need to be applied to an imaging device. That is, the present technology is applicable to general electronic apparatuses that use an imaging device for an image capturing unit (photoelectric conversion unit), such as an imaging device such as a digital still camera and a video camera, a portable terminal apparatus having an imaging function, and a copier that uses an imaging device for an image reading unit. The imaging device may be in a form formed as one chip or may be in a form of a module having an imaging function in which an imaging unit and a signal processing unit or optical system are packaged together.

Figure 28:
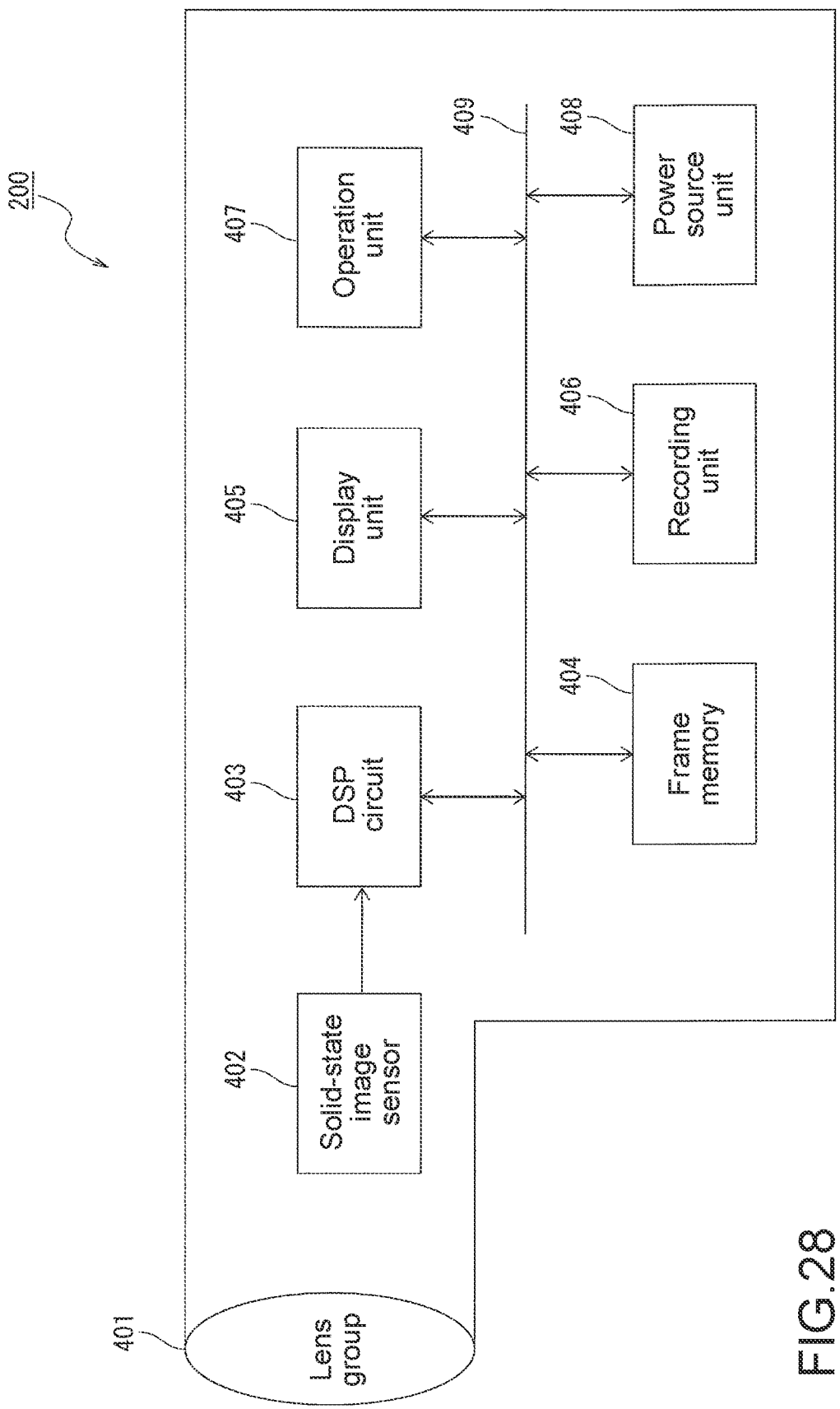
FIG. 28 is a block diagram showing a configuration example of an electronic apparatus to which the present technology is applied.

FIG. 28 is a block diagram showing a configuration example of an electronic apparatus 200 to which the present technology is applied. The electronic apparatus 200 in FIG. 28 includes an optical unit 401 including a lens group and the like, an imaging device 402 employing the configuration of the imaging device 100 shown in FIG. 12, and a DSP (Digital Signal Processor) circuit 403 that is a camera signal processing circuit. Further, the electronic apparatus 200 includes also a frame memory 404, a display unit 405, a recording unit 406, an operation unit 407, and a power source unit 408. The DSP circuit 403, the frame memory 404, the display unit 405, the recording unit 406, the operation unit 407, and the power source unit 408 are connected to each other via a bus line 409.

The optical unit 401 captures incident light (image light) from a subject and forms an image on the imaging surface of the imaging device 402. The imaging device 402 converts the amount of incident light whose image has been formed on the imaging surface by the optical unit 401 into an electrical signal for each pixel and outputs the electrical signal as a pixel signal. As the imaging device 402, the imaging device 100 shown in FIG. 12, i.e., an imaging device in which a pixel transistor (one of more of the transfer transistor TR, the reset transistor RST, the amplifier transistor AMP, and the selection transistor SEL) includes the MOS transistor Tr described in the first embodiment or the MOS transistor TrA described in the second embodiment can be used.

The display unit 405 includes, for example, a thin display such as an LCD (Liquid Crystal Display) and an organic EL (Electro Luminescence) display and displays a moving image or a still image taken by the imaging device 402. The recording unit 406 records the moving image or the still image taken by the imaging device 402 in a recording medium such as a hard disk and a semiconductor memory.

The operation unit 407 issues operations commands for various functions of the electronic apparatus 200 under the user's operation. The power source unit 408 appropriately supplies various power supplies that are operation power supplies of the DSP circuit 403, the frame memory 404, the display unit 405, the recording unit 406, and the operation unit 407 to these supply targets.

By using, as the imaging device 402, the imaging device 100 in which the amplifier transistor AMP includes the MOS transistor Tr (or the MOS transistor TrA), for example, it is possible to reduce the noise of the pixel signal to be output and improve the SN ratio. Therefore, it is possible to improve the image quality of captured images even in the electronic apparatus 200 such as a video camera, a digital still camera, and a camera module for mobile devices such as mobile phones.

Although an imaging device using electrons as signal charges, in which the first conductive type is a p-type and the second conductive type is an n-type, has been described in the above-mentioned example, the present technology is applicable also to an imaging device using holes as signal charges. That is, the first conductive type may be an n-type, the second conductive type may be a p-type, and the above-mentioned semiconductor regions may be semiconductor regions of opposite conductive types.

Further, the present technology is applicable not only to an imaging device that detects the distribution of the amount of incident light of visible light to take an image but also to general imaging devices (physical-quantity-distribution detecting devices) such as an imaging device that captures the distribution of the incident amount of infrared rays, X-rays, or particles as an image and a fingerprint detecting sensor that detects the distribution of another physical quantity such as a pressure and an electrostatic capacity to take an image in a broad sense.

Further, the present technology is applicable not only to an imaging device but also to general semiconductor apparatuses including another semiconductor integrated circuit.

It should be noted that the present disclosure may also take the following configurations.

(1) A semiconductor apparatus, including:
 a semiconductor substrate; and
 a field-effect transistor provided on the semiconductor substrate, in which the field-effect transistor includes
  a semiconductor region of a first conductive type in which a channel is formed,
  a gate electrode covering the semiconductor region, and a gate insulating film disposed between the semiconductor region and the gate electrode,
the semiconductor region has
an upper surface, and
a first side surface positioned on one side of the upper surface in a gate width direction of the gate electrode,
the gate electrode includes
a first portion facing the upper surface via the gate insulating film, and
a second portion facing the first side surface via the gate insulating film,
the gate insulating film includes
a first film portion positioned between the upper surface and the first portion, and
a second film portion positioned between the first side surface and the second portion, and
a film thickness of the second film portion is smaller in a portion thereof farther from the upper surface than in a portion thereof closer to the upper surface.

(2) The semiconductor apparatus according to (1) above, in which
the film thickness of the second film portion decreases as a distance from the upper surface increases.

(3) The semiconductor apparatus according to (1) or (2) above, further including
a first insulating thick film portion that is disposed between the semiconductor substrate and the second portion and has a film thickness larger than that of the second film portion.

(4) The semiconductor apparatus according to any one of (1) to (3) above, in which
the semiconductor region further has
a second side surface positioned on the other side of the upper surface in the gate width direction,
the gate electrode further includes
a third portion facing the second side surface via the gate insulating film,
the gate insulating film further includes
a third film portion positioned between the second side surface and the third portion, and
a film thickness of the third film portion is smaller in a portion farther from the upper surface than in a portion closer to the upper surface.

(5) The semiconductor apparatus according to (4) above, in which
the film thickness of the third film portion decreases as a distance from the upper surface increases.

(6) The semiconductor apparatus according to (4) or (5) above, further including
a second insulating thick film portion that is disposed between the semiconductor substrate and the third portion and has a film thickness larger than that of the third film portion.

(7) The semiconductor apparatus according to any one of (1) to (6) above, further including
an impurity diffusion layer of a first conductive type, the impurity diffusion layer being provided in the semiconductor substrate and positioned below the field-effect transistor.

(8) The semiconductor apparatus according to (7) above, in which
an impurity concentration of the first conductive type in the impurity diffusion layer is higher than that of the semiconductor region.

(9) The semiconductor apparatus according to any one of (1) to (8) above, further including
a device isolation layer that is provided on the semiconductor substrate and is disposed around the field-effect transistor, in which
a distance between the device isolation layer and the first side surface of the semiconductor region is shorted than a thickness of the device isolation layer.

(10) The semiconductor apparatus according to any one of (1) to (9) above, further including
a planar field-effect transistor provided in the semiconductor substrate.

(11) The semiconductor apparatus according to (10) above, in which
a thickness of the first film portion is larger than a thickness of a gate insulating film of the planar field-effect transistor.

(12) The semiconductor apparatus according to (10) above, in which
a thickness of the first film portion is smaller than a thickness of a gate insulating film of the planar field-effect transistor.

(13) An imaging device, including:
a sensor pixel that performs photoelectric conversion; and
a readout circuit that outputs a pixel signal based on charges output from the sensor pixel, in which
the readout circuit includes
an amplifier transistor that amplifies a signal of a voltage corresponding to a level of the charges output from the sensor pixel, and
a selection transistor that controls output timing of the pixel signal from the amplifier transistor,
at least one of the amplifier transistor or the selection transistor includes
a semiconductor region of a first conductive type in which a channel is formed,
a gate electrode covering the semiconductor region, and
a gate insulating film disposed between the semiconductor region and the gate electrode,
the semiconductor region has
an upper surface, and
a first side surface positioned on one side of the upper surface in a gate width direction of the gate electrode,
the gate electrode includes
a first portion facing the upper surface via the gate insulating film, and
a second portion facing the first side surface via the gate insulating film,
the gate insulating film includes
a first film portion positioned between the upper surface and the first portion, and
a second film portion positioned between the first side surface and the second portion, and
a film thickness of the second film portion is smaller in a portion thereof farther from the upper surface than in a portion thereof closer to the upper surface.

(14) An electronic apparatus, including:
an imaging device that includes
a sensor pixel that performs photoelectric conversion, and
a readout circuit that outputs a pixel signal based on charges output from the sensor pixel, in which the readout circuit includes
an amplifier transistor that amplifies a signal of a voltage corresponding to a level of the charges output from the sensor pixel, and
a selection transistor that controls output timing of the pixel signal from the amplifier transistor,
at least one of the amplifier transistor or the selection transistor includes
a semiconductor region of a first conductive type in which a channel is formed,
a gate electrode covering the semiconductor region, and
a gate insulating film disposed between the semiconductor region and the gate electrode,
the semiconductor region has
an upper surface, and
a first side surface positioned on one side of the upper surface in a gate width direction of the gate electrode,
the gate electrode includes
a first portion facing the upper surface via the gate insulating film, and
a second portion facing the first side surface via the gate insulating film,
the gate insulating film includes
a first film portion positioned between the upper surface and the first portion, and
a second film portion positioned between the first side surface and the second portion, and
a film thickness of the second film portion is smaller in a portion thereof farther from the upper surface than in a portion thereof closer to the upper surface.

REFERENCE SIGNS LIST 1, 1A, 1B semiconductor apparatus
10, 301 semiconductor substrate
10a, 301a surface
11 device isolation layer
13, 313 semiconductor region (channel region)
13a upper surface
13b first side surface
13c second side surface
15 gate electrode
17, 317 gate insulating film
19 source region
21 drain region
51 insulation film
53 oxide film
55 resist pattern
100 imaging device
111 substrate
102 sensor pixel
103 pixel region
104 vertical drive circuit
105 column signal processing circuit
106 horizontal drive circuit
107 output circuit
108 control circuit
109 vertical signal line
110 horizontal signal line
112 input/output terminal
113 pixel drive line
122 readout circuit
151 first portion
152 second portion
153 third portion
171 first film portion
172 second film portion
173 third film portion
174 first insulating thick film portion
175 second insulating thick film portion
200 electronic apparatus
251, 274, 275, 276, 277, 278, 279 $n^+$-type layer
252 $p^+$-type layer
255 pixel separation layer
256 p-type layer
257 n-type layer
272 device isolation layer
311, 312 well layer
315 interlayer insulating film
401 optical unit
402 imaging device
403 DSP circuit
404 frame memory
405 display unit
406 recording unit
407 operation unit
408 power source unit
409 bus line
AG, RG, SG, TG gate electrode
AMP amplifier transistor
FC floating capacitor
FD floating diffusion
FDG conversion efficiency switch
H1, H2 trench
L1 to L11 wire
P1 to P8 line (equipotential line)
PD photodiode
PU, PUA, PUB, PUC, PUD pixel unit
RST reset transistor
SEL selection transistor
Tr, TrA, TrB, Trc MOS transistor(FinFET)
Tr' planar MOS transistor
TR transfer transistor
VDD power supply line

What is claimed is:
1. A semiconductor apparatus, comprising:
a semiconductor substrate; and
a field-effect transistor provided on the semiconductor substrate, wherein
the field-effect transistor includes
a semiconductor region of a first conductive type in which a channel is formed,
a gate electrode covering the semiconductor region, and
a gate insulating film disposed between the semiconductor region and the gate electrode,
the semiconductor region has
an upper surface, and
a first side surface positioned on one side of the upper surface in a gate width direction of the gate electrode,
the gate electrode includes
a first portion facing the upper surface via the gate insulating film, and
a second portion facing the first side surface via the gate insulating film,
the gate insulating film includes
a first film portion positioned between the upper surface and the first portion, and
a second film portion positioned between the first side surface and the second portion, and a film thickness of the second film portion is smaller in a portion thereof farther from the upper surface than in a portion thereof closer to the upper surface.

2. The semiconductor apparatus according to claim 1, wherein
the film thickness of the second film portion decreases as a distance from the upper surface increases.

3. The semiconductor apparatus according to claim 1, further comprising
a first insulating thick film portion that is disposed between the semiconductor substrate and the second portion and has a film thickness larger than that of the second film portion.

4. The semiconductor apparatus according to claim 1, wherein
the semiconductor region further has
a second side surface positioned on the other side of the upper surface in the gate width direction,
the gate electrode further includes
a third portion facing the second side surface via the gate insulating film,
the gate insulating film further includes
a third film portion positioned between the second side surface and the third portion, and
a film thickness of the third film portion is smaller in a portion farther from the upper surface than in a portion closer to the upper surface.

5. The semiconductor apparatus according to claim 4, wherein
the film thickness of the third film portion decreases as a distance from the upper surface increases.

6. The semiconductor apparatus according to claim 4, further comprising
a second insulating thick film portion that is disposed between the semiconductor substrate and the third portion and has a film thickness larger than that of the third film portion.

7. The semiconductor apparatus according to claim 1, further comprising
an impurity diffusion layer of a first conductive type, the impurity diffusion layer being provided in the semiconductor substrate and positioned below the field-effect transistor.

8. The semiconductor apparatus according to claim 7, wherein
an impurity concentration of the first conductive type in the impurity diffusion layer is higher than that of the semiconductor region.

9. The semiconductor apparatus according to claim 1, further comprising
a device isolation layer that is provided on the semiconductor substrate and is disposed around the field-effect transistor, wherein
a distance between the device isolation layer and the first side surface of the semiconductor region is shorted than a thickness of the device isolation layer.

10. The semiconductor apparatus according to claim 1, further comprising
a planar field-effect transistor provided in the semiconductor substrate.

11. The semiconductor apparatus according to claim 10, wherein
a thickness of the first film portion is larger than a thickness of a gate insulating film of the planar field-effect transistor.

12. The semiconductor apparatus according to claim 10, wherein
a thickness of the first film portion is smaller than a thickness of a gate insulating film of the planar field-effect transistor.

13. An imaging device, comprising:
a sensor pixel that performs photoelectric conversion; and
a readout circuit that outputs a pixel signal based on charges output from the sensor pixel, wherein
the readout circuit includes
an amplifier transistor that amplifies a signal of a voltage corresponding to a level of the charges output from the sensor pixel, and
a selection transistor that controls output timing of the pixel signal from the amplifier transistor,
at least one of the amplifier transistor or the selection transistor includes
a semiconductor region of a first conductive type in which a channel is formed,
a gate electrode covering the semiconductor region, and
a gate insulating film disposed between the semiconductor region and the gate electrode,
the semiconductor region has
an upper surface, and
a first side surface positioned on one side of the upper surface in a gate width direction of the gate electrode,
the gate electrode includes
a first portion facing the upper surface via the gate insulating film, and
a second portion facing the first side surface via the gate insulating film,
the gate insulating film includes
a first film portion positioned between the upper surface and the first portion, and
a second film portion positioned between the first side surface and the second portion, and
a film thickness of the second film portion is smaller in a portion thereof farther from the upper surface than in a portion thereof closer to the upper surface.

14. An electronic apparatus, comprising:
an imaging device that includes
a sensor pixel that performs photoelectric conversion, and
a readout circuit that outputs a pixel signal based on charges output from the sensor pixel, wherein
the readout circuit includes
an amplifier transistor that amplifies a signal of a voltage corresponding to a level of the charges output from the sensor pixel, and
a selection transistor that controls output timing of the pixel signal from the amplifier transistor,
at least one of the amplifier transistor or the selection transistor includes
a semiconductor region of a first conductive type in which a channel is formed,
a gate electrode covering the semiconductor region, and
a gate insulating film disposed between the semiconductor region and the gate electrode,
the semiconductor region has
an upper surface, and
a first side surface positioned on one side of the upper surface in a gate width direction of the gate electrode,
the gate electrode includes
a first portion facing the upper surface via the gate insulating film, and a second portion facing the first side surface via the gate insulating film, the gate insulating film includes a first film portion positioned between the upper surface and the first portion, and a second film portion positioned between the first side surface and the second portion, and a film thickness of the second film portion is smaller in a portion thereof farther from the upper surface than in a portion thereof closer to the upper surface.

\* \* \* \* \*